US009127204B2

(12) United States Patent
Yun et al.

(10) Patent No.: US 9,127,204 B2
(45) Date of Patent: Sep. 8, 2015

(54) FLUORESCENT SUBSTANCE AND METHOD FOR PREPARING SAME

(75) Inventors: Bong Goo Yun, Gangwon-Do (KR); Woo Jung Park, Gyeonggi-do (KR); Won Young Song, Seoul (KR); Jeong Eun Yun, Gyeonggi-do (KR); Tae Min Ahn, Incheon (KR); Chul Soo Yoon, Gyeonggi-do (KR); Young Il Kim, Gyeongsangbuk-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 261 days.

(21) Appl. No.: 13/825,098

(22) PCT Filed: Sep. 27, 2011

(86) PCT No.: PCT/KR2011/007072
§ 371 (c)(1),
(2), (4) Date: Jun. 7, 2013

(87) PCT Pub. No.: WO2012/044026
PCT Pub. Date: Apr. 5, 2012

(65) Prior Publication Data
US 2013/0264597 A1 Oct. 10, 2013

(30) Foreign Application Priority Data
Sep. 27, 2010 (KR) .................. 10-2010-0093200

(51) Int. Cl.
*C09K 11/80* (2006.01)
*C01F 17/00* (2006.01)
(Continued)

(52) U.S. Cl.
CPC ......... *C09K 11/7734* (2013.01); *C01B 21/0821* (2013.01); *C01B 21/0823* (2013.01);
(Continued)

(58) Field of Classification Search
CPC .......... C09K 11/0883; C09K 11/7734; H01L 33/502
USPC ......... 252/301.4 F, 301.4 R; 313/503; 257/98
See application file for complete search history.

(56) References Cited

U.S. PATENT DOCUMENTS

2003/0030038 A1 2/2003 Mitomo et al.
2008/0048151 A1 2/2008 Shioi

FOREIGN PATENT DOCUMENTS

EP 1264873 * 12/2002
EP 1264873 A2 12/2002
(Continued)

OTHER PUBLICATIONS

Lei et al, "Preparation of (Sr0.5Ba0.5)Si2N2O2:Eu2+ phoshor and Its Luminescence Properties", Chem. Lett. 2011, 40, Dec. 28, 2010, pp. 140-141.*
(Continued)

*Primary Examiner* — Carol M Koslow
(74) *Attorney, Agent, or Firm* — McDermott Will & Emery LLP

(57) ABSTRACT

Disclosed is a method for preparing a fluorescent substance, which is represented by the formula $M_{1-z}Eu_zSi_aO_bN_c$ ($M=Sr_{1-x-y}Ba_xCa_y$, 0 x 0.5, 0 y 0.2, 0<z 0.3, 2 a 2.5, 1.5 b 2, and 2 c 2.5), and the present invention provides the method for preparing a nitride-based fluorescent substance comprising the following steps: a preliminary firing step further comprising a first firing step of creating a first firing product by mixing and firing a first precursor group including an M precursor and a first silicon precursor, and a second firing step of creating a second firing product by mixing and firing a second precursor group including an Eu precursor and a second silicon precursor; and a secondary firing step of mixing and firing the first firing product and the second firing product.

30 Claims, 16 Drawing Sheets

(51) Int. Cl.
  *H01L 33/00* (2010.01)
  *C09K 11/77* (2006.01)
  *C01B 21/082* (2006.01)
  *C09K 11/08* (2006.01)
  *H01L 33/50* (2010.01)

(52) U.S. Cl.
  CPC .......... *C09K11/0883* (2013.01); *H01L 33/502* (2013.01); *C01P 2002/50* (2013.01); *C01P 2002/52* (2013.01); *C01P 2002/72* (2013.01); *C01P 2002/84* (2013.01)

(56) References Cited

FOREIGN PATENT DOCUMENTS

| JP | 2006-077079 A | 3/2006 |
|---|---|---|
| JP | 2007-177010 A | 7/2007 |
| KR | 20070021140 A | 2/2007 |
| KR | 20080009212 A | 1/2008 |
| KR | 20090019677 A | 2/2009 |
| KR | 20090099693 A | 9/2009 |
| WO | WO-2009/104651 A1 | 8/2009 |

OTHER PUBLICATIONS

Chinese Office Action issued in Chinese Application No. 201180056644.7, dated Dec. 12, 2014, with English translation.
Zhang et al., "A tunable green alkaline-earth silicon-oxynitride solid solution (Ca1_• Sr x )Si2O2 N2 :Eu2+ and its application in LED", Applied Physics B-lasers and Optics, (2008), vol. 93, pp. 829-835.
Bachmann et al., "Color point tuning for (Sr,Ca,Ba)Si2O2N2:Eu2+ for white light LEDs", Chemistry of Materials, vol. 21, issue: 2 (2009), pp. 316-325.

* cited by examiner

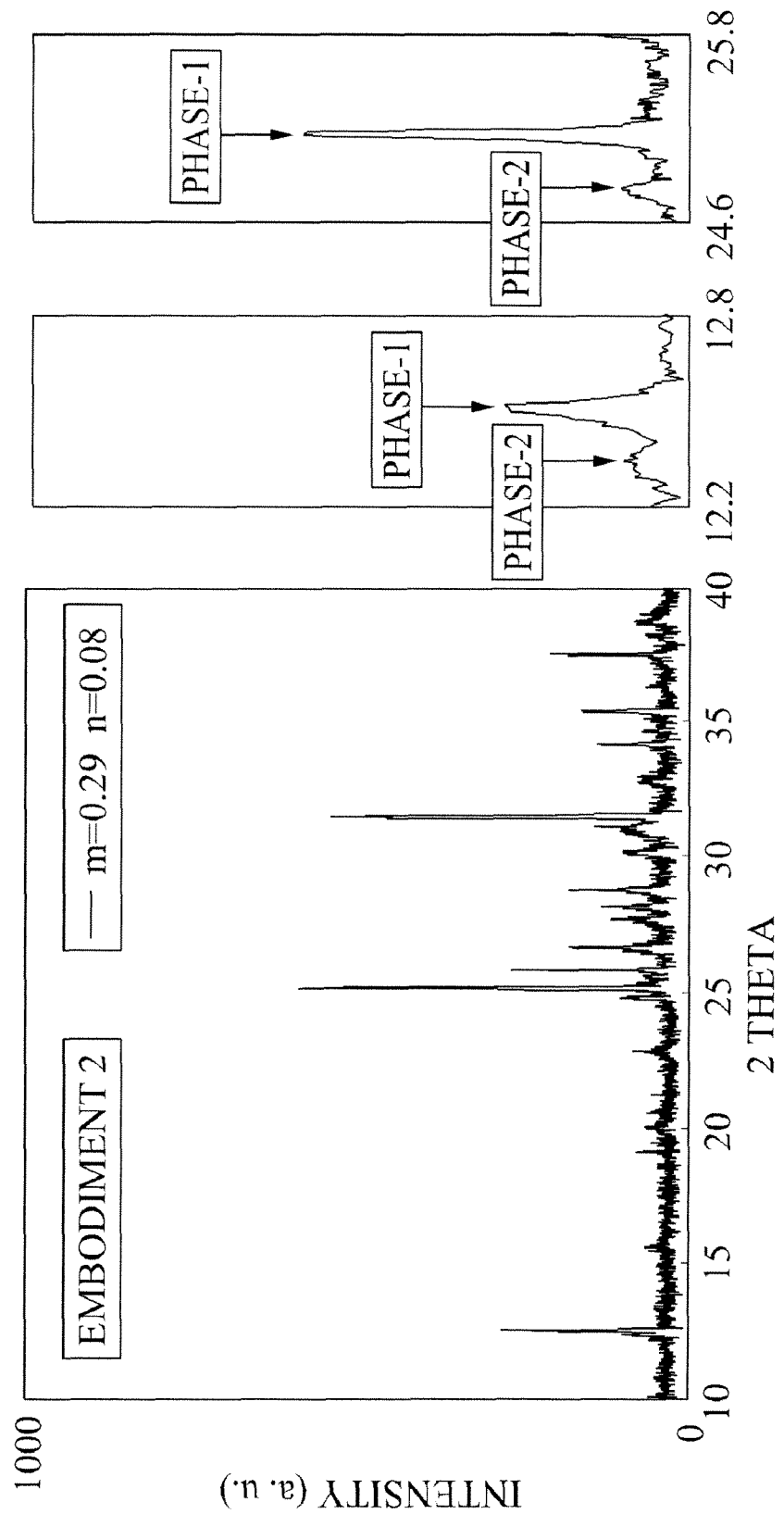

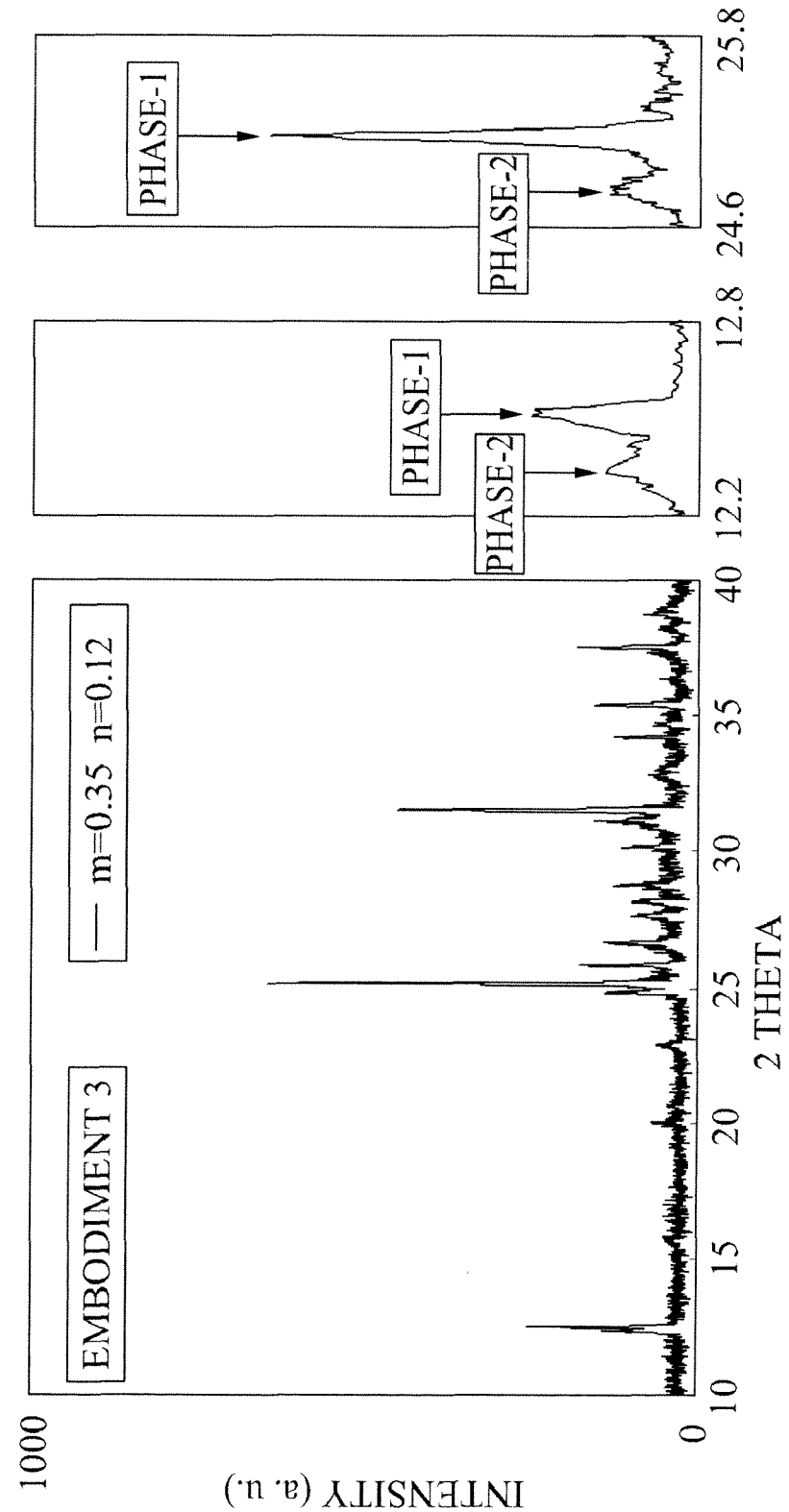

FLUORESCENT SUBSTANCE AND METHOD FOR PREPARING SAME

CROSS-REFERENCE TO RELATED APPLICATIONS

This application is the U.S. National Stage of International Application No. PCT/KR2011/007072, filed Sep. 27, 2011, published in Korean, and claims benefit of priority to Korean Patent Application No. 10-2010-0093200 filed on Sep. 27, 2010, in the Korean Intellectual Property Office, the entire contents of which are hereby incorporated by reference.

TECHNICAL FIELD

The present inventive concept relates to a phosphor having excellent high-temperature stability and high emission characteristics when applied to a light emitting diode (LED).

BACKGROUND

A white light emitting diode (LED) has low power consumption and long lifespan, while not containing toxic heavy metals such as mercury. Therefore, the white LED is being spotlighted as a next-generation artificial light source effective for energy saving and environment protection. Due to such characteristics, the white LED is being quickly put to practical use as a back light unit (BLU) for a liquid crystal display (LCD)-TV, a headlamp for a vehicle, and other general lighting. Demand for the white LED will rapidly increase.

In the present day, the white LED is manufactured mostly by applying yellow phosphor onto a blue LED chip. That is, the above method achieves a white light through combination of a blue light emitted from a blue LED and a yellow light emitted from a phosphor excited by part of the blue light. A representative of the phosphor emitting the yellow light is YAG:Ce3+((Y,Gd)3(Al,Ga)5O12:Ce3+) of Nichia Chemical (Japan), which is known by a high emission efficiency and chemical stability.

Recently, researches are in progress to find a substitute for the yellow phosphor of Nichia Chemical. A phosphor having an oxynitride as a mother body material, such as MSi2O2N2:Eu2+, may be an example of the substitute. The oxynitride-based phosphor is chemically stable and is capable of shifting a light emission wavelength by varying an M ion type and an Eu ion concentration. Accordingly, the oxynitride-based phosphor is attracting attention as a phosphor for the white LED. In addition, the oxynitride-based phosphor has a crystalline structure where M ions and Eu ions are 2-dimensionally (2D) arranged between a 2D layered structure constituted by SiON3 tetrahedrons. Therefore, the oxynitride-based phosphor is expected to show considerably low emission reduction caused due to concentration quenching, in comparison with a phosphor having an 3D arrangement of Eu ions.

In general, the oxynitride-based phosphor is synthesized by a solid phase method that uses solid powder as a raw material. However, the solid phase method is capable of generating a nearly single-phase material only when no Eu or low-concentration Eu is added. When high-concentration Eu is added, that is, when raw materials of Eu (generally, Eu2O3) are increased, content of oxygen may become excessive, thereby easily producing impurities. As a result, the oxynitride-based phosphor may be hardly synthesized in the single phase.

SUMMARY

An aspect of the present inventive concept relates to an improved yellow phosphor capable of replacing a conventional Yttrium Aluminum Garnet (YAG) phosphor by having excellent high-temperature stability and high emission characteristics, and a method for manufacturing the same.

One aspect of the present inventive concept encompasses a method of manufacturing a nitride-based phosphor. The method includes a first sintering step and a second sintering step. The first sintering step divides a plurality of precursors into at least two groups and sinters the respective groups. The second sintering step mixes and sinters products generated after the sintering of respective ones of the at least two groups.

At least one of the plurality of precursors may be contained in each of the at least two groups.

A sintering temperature in the second sintering step may be higher than a sintering temperature in the first sintering step.

The second sintering step may be performed under a nitrogen and hydrogen gas atmosphere.

Another aspect of the present inventive concept relates to a method for manufacturing a phosphor expressed by a composition formula $M_{1-z}Eu_zSi_aO_bN_c$ ($M=Sr_{1-x-y}Ba_xCa_y$, $0 \leq x \leq 0.5$, $0 \leq y \leq 0.2$, $0 < z \leq 0.3$, $2 \leq a \leq 2.5$, $1.5 \leq b \leq 2$, and $2 \leq c \leq 2.5$). The method includes a first sintering step and a second sintering step. The first sintering step includes a first mixture sintering step to generate a first sintered product by mixing and sintering a first precursor group that contains an M precursor and a first Si precursor, and a second mixture sintering step to generate a second sintered product by mixing and sintering a second precursor group that contains an Eu precursor and a second Si precursor. The second sintering step mixes and sinters the first sintered product and the second sintered product.

The first sintering step may include generating the first sintered product by mixing and sintering the first precursor group containing $MCO_3$ and $SiO_2$ and generating the second sintered product by mixing and sintering the second group containing $Eu_2O_3$, $SiO_2$ and $Si_3N_4$.

The first mixture sintering step may be performed at temperature of about 900° C. to about 1300° C.

The second mixture sintering step may be performed at temperature of about 1200° C. to about 1400° C.

In the second mixture sintering step, a silicon nitride compound may be added.

In the second mixture sintering step, $Si_3N_4$ may be added.

The second mixture sintering step may include adding at least one of $NH_4A$ where A denotes at least one of F and Cl, $DE_2$ where D denotes at least one of Ca, Sr, and Ba and E denotes at least one of F and Cl, and LE where L denotes at least one of Na and K and E denotes at least one of F and Cl.

The second mixture sintering step may be performed under a nitrogen and hydrogen gas atmosphere.

The second mixture sintering step may be performed at temperature of about 1.300° C. to about 1600° C.

The first sintered product may include a solid solution containing at least two kinds of M ions.

The second sintered product may include $EuSi_2O_2N_2$.

Another aspect of the present inventive concept relates to a phosphor in a single phase expressed by a composition formula $M_{1-z}Eu_zSi_aO_bN_c$ ($M=Sr_{1-x-y}Ba_xCa_y$, $0 \leq x \leq 0.5$, $0 \leq y \leq 0.2$, $0 < z \leq 0.3$, $2 \leq a \leq 2.5$, $1.5 \leq b \leq 2$, and $2 \leq c \leq 2.5$). A concentration of an oxynitride having an atomic ratio of O/N>1 is 1 mol % or less with respect to the whole phosphor.

At a temperature of about 150° C. to about 200° C., which is a driving temperature of a light emitting diode (LED), the phosphor may have at least 80% emission intensity of an emission intensity under normal temperature.

Yet another aspect of the present inventive concept encompasses a white LED including a phosphor in a single phase expressed by a composition formula $M_{1-z}Eu_zSi_aO_bN_c$ ($M=Sr_{1-x-y}Ba_xCa_y$, $0 \leq x \leq 0.5$, $0 \leq y \leq 0.2$, $0 < z \leq 0.3$, $2 \leq a \leq 2.5$, $1.5 \leq b \leq 2$, and $2 \leq c \leq 2.5$), as a yellow phosphor which is a wavelength converting material. A concentration of an oxynitride having an atomic ratio of O/N>1 is 1 mol % or less with respect to the whole phosphor.

At a temperature of about 150° C. to about 200° C., the white LED may have at least 80% emission intensity of an emission intensity under normal temperature.

Still another aspect of the present inventive concept relates to a nitride-based phosphor as a phosphor expressed by a composition formula $M_{1-n}Eu_nSi_aO_bN_c$ ($M=Sr_{1-m}Ba_m$, $0.25 < m \leq 0.3$, $0 < m \times (1-n) < 0.25$, $2 \leq a \leq 2.5$, $1.5 \leq b \leq 2$, and $2 \leq c \leq 2.5$). A concentration of an oxynitride having an atomic ratio of O/N>1 is 0.01 mol % or less with respect to the whole phosphor.

The phosphor may have a triclinic crystal system and a space group of P1.

The phosphor may include a complete solid solution in an Sr—Eu system or Sr—Ba—Eu system.

Diffraction angles with respect to three diffraction peaks having a high intensity may be in ranges of $12.50 \leq 2\theta \leq 12.60$, $25.16 \leq 2\theta \leq 25.30$, and $31.51 \leq 2\theta \leq 31.65$, respectively, in an X-ray diffraction (XRD) pattern of the phosphor.

The phosphor may have an emission wavelength in a range of 460 nm to 750 nm.

The foregoing and/or other aspects are also achieved by providing a nitride-based phosphor as a single-phase phosphor expressed by a composition formula $M_{1-n}Eu_nSi_aO_bN_c$ ($M=Sr_{1-m}Ba_m$, $0.6 \leq m \leq 0.8$, $0.5 \leq m \times (1-n) < 0.65$, $2 \leq a \leq 2.5$, $1.5 \leq b \leq 2$, and $2 \leq c \leq 2.5$). A concentration of an oxynitride having an atomic ratio of O/N>1 is 0.01 mol % or less with respect to the whole phosphor.

The phosphor may have a triclinic crystal system and a space group of P1.

The phosphor may include a complete solid solution in an Sr—Ba—Eu system.

Diffraction angles with respect to four diffraction peaks having a high intensity may be in ranges of $12.30 \leq 2\theta \leq 12.38$, $24.75 \leq 2\theta \leq 24.88$, $25.56 \leq 2\theta \leq 25.62$, and $31.09 \leq 2\theta \leq 31.25$, respectively, in an XRD pattern of the phosphor.

The phosphor may have an emission wavelength in a range of 465 nm to 765 nm.

An aspect of the present inventive concept encompasses a nitride-based phosphor as a mixed-phase phosphor generated from an initial composition $M_{1-n}Eu_nSi_aO_bN_c$ ($M=Sr_{1-m}Ba_m$, $0.3 \leq m \leq 0.6$, $0.25 \leq m \times (1-n) < 0.5$, $2 \leq a \leq 2.5$, $1.5 \leq b \leq 2$, and $2 \leq c \leq 2.5$). A concentration of an oxynitride having an atomic ratio of O/N>1 is 0.01 mol % or less with respect to the whole phosphor.

The phosphor may include two different phases having a triclinic crystal system and a space group of P1.

The phosphor may include two different phases forming a complete solid solution in an Sr—Ba—Eu system.

In an XRD pattern of the phosphor, one of the two different phases may have diffraction angles with respect to three diffraction peaks having a high intensity, the diffraction angles being in ranges of $12.47 \leq 2\theta \leq 12.49$, $25.13 \leq 2\theta \leq 25.15$, and $31.48 \leq 2\theta \leq 31.50$, respectively, and the other one may have diffraction angles with respect to three diffraction peaks having a high intensity, the diffraction angles being in ranges of $12.39 \leq 2\theta \leq 12.45$, $24.89 \leq 2\theta \leq 24.95$, and $31.26 \leq 2\theta \leq 31.41$, respectively.

The phosphor may have an emission wavelength in a range of 460 nm to 760 nm.

A nitride-based phosphor according to example embodiments of the present inventive concept may be formed in a single phase even with high Eu concentration. Also, since the nitride-based phosphor has excellent high-temperature stability and crystallinity, a yellow phosphor improved in emission characteristic may be achieved.

In addition, according to a method for manufacturing the nitride-based phosphor according to example embodiments of the present inventive concept, a solid solution containing at least two kinds of M ions may be synthesized. Also, production of impurities, caused by increase of oxygen in a feed composition, may be effectively reduced.

BRIEF DESCRIPTION OF DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

FIGS. 7A and 7B illustrate graphs respectively showing an X-ray diffraction (XRD) pattern and an emission spectrum of a phosphor manufactured in a second embodiment of the present inventive concept.

FIGS. 8A and 8B illustrate graphs respectively showing an XRD pattern and an emission spectrum of a phosphor manufactured in a third embodiment of the present inventive concept.

DETAILED DESCRIPTION

Figure 1:
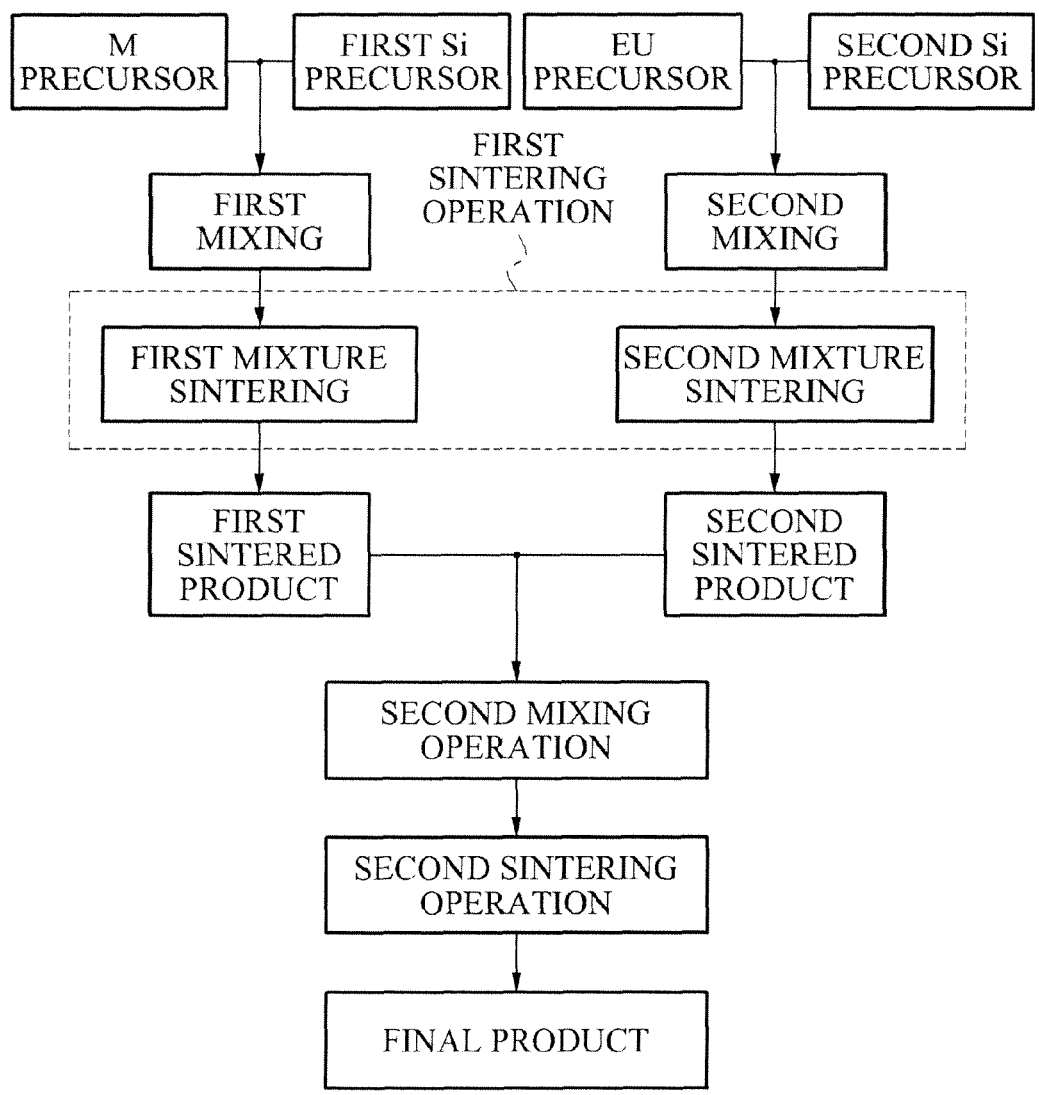
FIG. 1 illustrates a flowchart conceptually showing a method for manufacturing a nitride-based phosphor according to example embodiments of the present inventive concept.

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

FIG. 1 illustrates a flowchart conceptually showing a method for manufacturing a nitride-based phosphor according to example embodiments of the present inventive concept.

Referring to FIG. 1, first, a plurality of precursors may be prepared to manufacture the nitride-based phosphor. The plurality of precursors may be divided into two groups, that is, a first group and a second group. The first group may include an M precursor containing at least one of Ca, Sr, and Ba, and a first Si precursor. The second group may include an Eu precursor and a second Si precursor. Alternatively, the plurality of precursors may be divided into three or more groups.

The M precursor may include metal carbonate ($MCO_3$). The first Si precursor may include $SiO_2$. The Eu precursor may be $Eu_2O_3$. The second Si precursor may include $SiO_2$ and $Si_3N_4$. Thus, the first Si precursor and the second Si precursor may both include the same precursor, that is, $SiO_2$.

The precursors of each group undergo a mixing process. Any of a dry mixing method or a wet mixing method may be used to mix the precursors.

For example, according to the wet mixing method, the precursors may be mixed along with a solvent and a ball that assists grinding. The ball may be made of $Si_3N_4$, $Al_2O_3$, $ZrO_2$, or the like. The solvent may be a deionized (DI) water, an alcohol such as ethanol, or an organic solvent such as n-hexane. The precursors may be sealed along with the solvent and the ball, and uniformly mixed by a miller or the like. A mixture generated by the mixing process may be separated from the ball. The solvent may be mostly vaporized by a drying process using an oven. Powder remaining after the drying process may be uniformly ground into micrometer particles using a sieve made of metal or polymer.

According to the dry mixing method, the precursors may be put in a container without a solvent and uniformly mixed by a milling machine. Here, a ball may also be used to promote the mixing. The dry mixing method may reduce the processing time compared to the wet mixing time because a solvent drying process is omitted. As in the wet mixing method, powder remaining after the mixing of the precursors may be uniformly ground into a desired size using a sieve made of metal or polymer.

The mixed precursors of each group respectively may undergo a first sintering operation. After the first sintering operation, a first sintered product and a second sintered product may be produced as intermediate products. The first sintered product and the second sintered product are mixed by the above-described mixing methods and go through a second sintering operation, thereby obtaining a final phosphor. In the second sintering operation, an additional Si precursor or a flux may be added before the mixing. The flux may facilitate movement among the first sintered product, the second sintered product, and the additional Si precursor added in the second sintering operation, thereby improving crystallinity and grain growth of the nitride-based phosphor, that is, a final product. A sintering temperature of the second sintering operation may be higher than a sintering temperature of the first sintering operation. The second sintering operation may be performed under a nitrogen and oxygen gas atmosphere.

Hereinafter, a description will be made about a method for manufacturing a nitride-based yellow phosphor having a composition formula $M_{1-z}Eu_zSi_aO_bN_c$ ($M=Sr_{1-x-y}Ba_xCa_y$, $0 \leq x \leq 0.5$, $0 \leq y \leq 0.2$, $0 < z \leq 0.3$, $2 \leq a \leq 2.5$, $1.5 \leq b \leq 2$, and $2 \leq c \leq 2.5$).

As described above, the first group may include the M precursor containing at least one of Ca, Sr, and Ba, and the first Si precursor. The second group may include the Eu precursor and the second Si precursor. The M precursor may include metal carbonate ($MCO_3$). The first Si precursor may include $SiO_2$. The Eu precursor may be $Eu_2O_3$. The second Si precursor may include $SiO_2$ or $Si_3N_4$.

After the mixing is completed, the precursors of the first group are sintered at temperature of about 900° C. to about 1300° C. The sintering of the precursors of the first group may be performed under air atmosphere for about 3 hours. The precursors of the second group may be sintered at temperature of about 1200° C. to about 1400° C., and under a nitrogen and hydrogen gas atmosphere. The precursors of the second group may be sintered also for about 3 hours.

When the precursors are used, a sintered product of the first group may contain $M_2SiO_4$ while a sintered product of the second group may contain $EuSi_2O_2N_2$.

As described above, when the intermediate products of $M_2SiO_4$ and $EuSi_2O_2N_2$ are formed in advance and used as raw materials of Si and Eu, respectively, production of impurities may be restrained. Accordingly, even though concentration of Eu increases, the nitride-phosphor may be synthesized in a single phase.

The intermediate product $M_2SiO_4$ is easy to synthesize in a single phase in the atmosphere. Since intermediate product $M_2SiO_4$ enables synthesis of a solid solution containing at least two kinds of M ions, a nitride-based phosphor containing at least two kinds of M ions may also be synthesized. Another intermediate product $EuSi_2O_2N_2$ may restrain increase of oxygen in a starting composition by fixing a composition ratio among $Eu_2O_3$, $SiO_2$ and $Si_3N_4$ which are starting materials. Therefore, the phosphor may be synthesized in a single phase without producing impurities. Also, since $EuSi_2O_2N_2$ is used as a raw material of Eu, oxygen in a feed composition does not increase even though concentration of Eu increases. Therefore, production of impurities may be restrained, and a phosphor having a composition formula $M_{1-z}Eu_zSi_aO_bN_c$ ($M=Sr_{1-x-y}Ba_xCa_y$, $0 \leq x \leq 0.5$, $0 \leq y \leq 0.3$, $2 < z \leq 0.3$, $2 \leq a \leq 2.5$, $1.5 \leq b \leq 2$, and $2 \leq c \leq 2.5$) may be generated in a single phase.

Before the second sintering operation, the intermediate products $M_2SiO_4$ and $EuSi_2O_2N_2$ may be mixed along with the additional Si precursor and the flux according to the above-described mixing method. The additional Si precursor may be $Si_3N_4$. The flux may be $NH_4A$ (A denotes at least one of F and Cl), $DE_2$ D denotes at least one of Cu, Sr, and Ba, and E denotes at least one of F and Cl), LE (L denotes at least one of Na and K and E denotes at least one of F and Cl), or the like. The flux may promote movement of $M_2SiO_4$, $EuSi_2O_2N_2$, and $Si_3N_4$, thereby improving crystallinity and grain growth of $MSi_2O_2N_2:Eu^{2+}$. Accordingly, the emission intensity of the phosphor may be increased. The second sintering operation may be performed under a nitrogen and hydrogen gas atmosphere, at a sintering temperature of about 1300° C. to about 1600° C.

Hereinafter, a nitride-base phosphor manufactured by the above method will be described.

The nitride-base phosphor according to the example embodiments of the present inventive concept may be expressed by a composition formula $M_{1-z}Eu_zSi_aO_bN_c$ ($M=Sr_{1-x-y}Ba_xCa_y$, $0 \leq x \leq 0.5$, $0 \leq y \leq 0.2$, $0 < z \leq 0.3$, $2 \leq a \leq 2.5$, $1.5 \leq b \leq 2$, and $2 \leq c \leq 2.5$). The nitride-based phosphor may be a single-phase yellow phosphor. With respect to the whole phosphor, concentration of an oxynitride having an atomic ratio of O/N>1 may be 1 mol % or less. Depending on embodiments of the present inventive concept, the nitride-base phosphor may substantially include only a single phase. During manufacturing of the nitride-base phosphor according to example embodiments of the present inventive concept, an oxynitride of an impurity, such as $M_3Si_6O_9N_4$, may not be produced. In addition, $EuSi_2O_2N_2$, which is an intermediate sintered product generated during the manufacturing, may restrain increase of oxygen in the starting composition by fixing the composition ratio among $Eu_2O_3$, $SiO_2$ and $Si_3N_4$ which are starting materials. Accordingly, the phosphor may be synthesized in a single phase without production of impurities.

When a light emitting diode (LED) is driven, the nitride-based phosphor under a temperature condition of about 150° C. to about 200° C. may have at least 80% emission intensity of an emission intensity under normal temperature, which corresponds to almost 90% of an emission intensity of a conventional Yttrium Aluminum Garnet (YAG) phosphor. Therefore, the nitride-based phosphor has excellent high-temperature stability and high emission characteristics. That is, application characteristic of the nitride-based phosphor with respect to the LED is more excellent compared to the conventional YAG phosphor.

Hereinafter, a nitride-based phosphor manufacturing method according to example embodiments of the present inventive concept will be described in detail.

EMBODIMENTS

Embodiment 1

Figure 2:
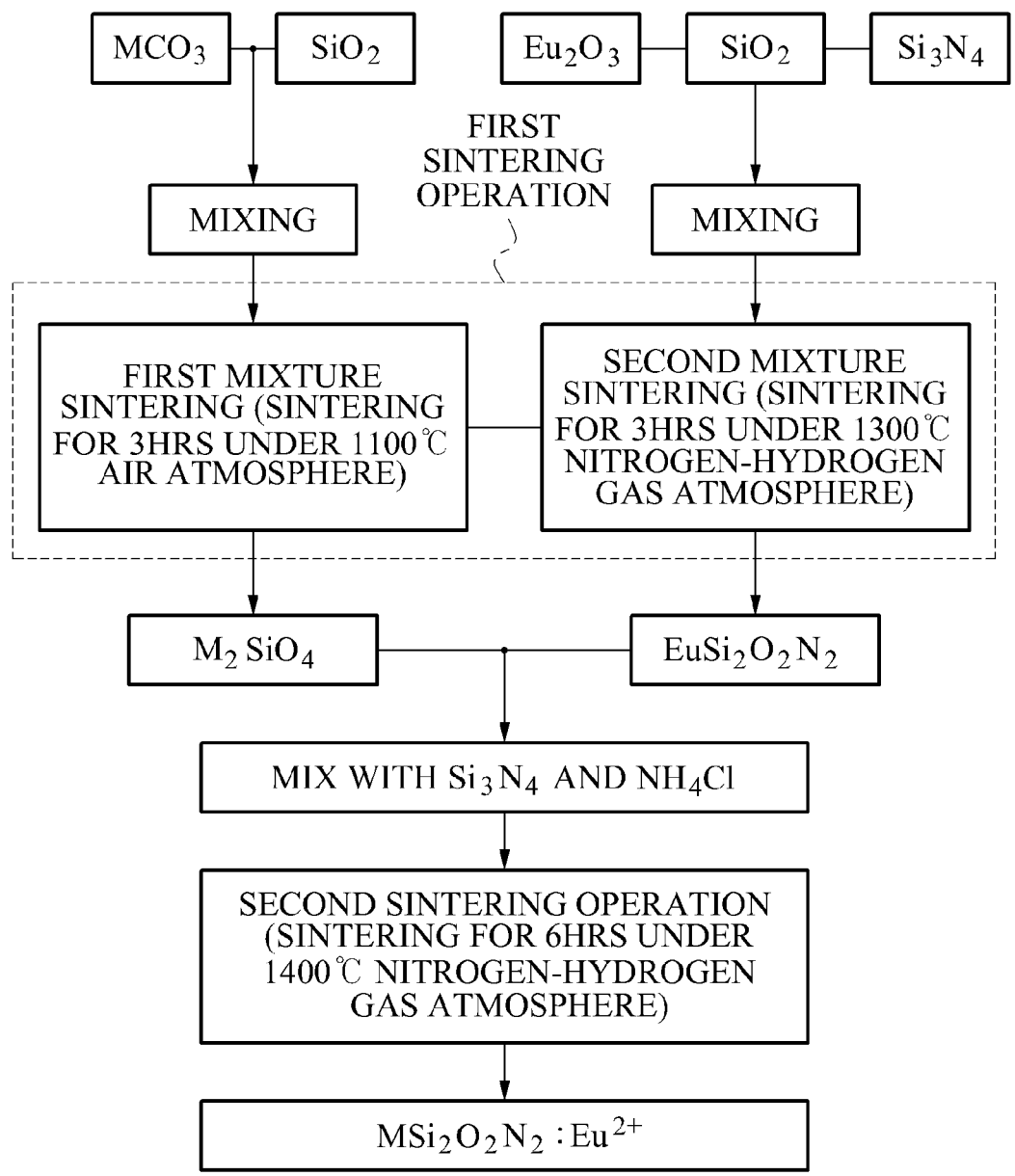
FIG. 2 illustrates a flowchart showing a method for manufacturing a nitride-based phosphor according to a first embodiment of the present inventive concept.

A first embodiment of the present inventive concept suggests a method for manufacturing a phosphor $(Sr_{0.75}Ba_{0.25})_{0.85}Eu_{0.15}Si_2O_2N_2$. FIG. 2 is a flowchart illustrating the phosphor manufacturing method according to the first embodiment of the present inventive concept. The phosphor of the first embodiment of the present inventive concept is manufactured according to an order shown in FIG. 2. Referring to FIG. 2, precursors $MCO_3(SrCO_3, BaCO_3)$ and $SiO_2$ belonging to a first group are mixed, and sintered for about 3 hours at temperature of about 1100° C. under air atmosphere, thereby obtaining an intermediate sintered product $M_2SiO_4$. Likewise, precursors $Eu_2O_3$, $SiO_2$ and $Si_3N_4$ belonging to a second group are mixed, and sintered for about 3 hours at temperature of about 1300° C. under a nitrogen and hydrogen gas atmosphere, thereby obtaining an intermediate sintered product $EuSi_2O_2N_2$. Next, the intermediate sintered products $M_2SiO_4$ and $EuSi_2O_2N_2$ are mixed with $Si_3N_4$ that is an additional Si precursor and $NH_4Cl$ that is a flux. Thus-generated mixture is sintered again at temperature of about 1400° C. under a nitrogen and hydrogen gas atmosphere, thereby manufacturing a phosphor having a composition formula $(Sr_{0.75}Ba_{0.25})_{0.85}Eu_{0.15}Si_2O_2N_2$ as a final product.

COMPARISON EXAMPLES

Comparison Example 1

Figure 3:
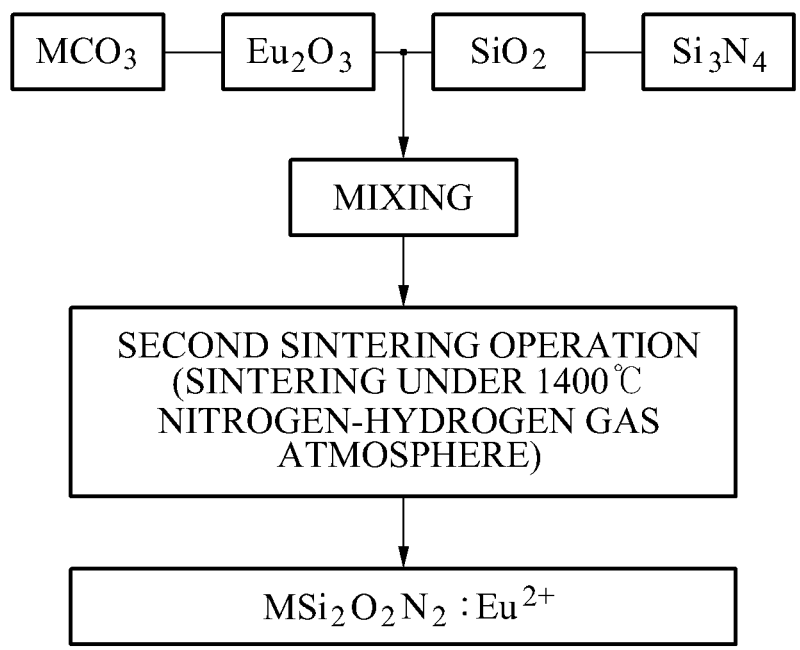
FIG. 3 illustrates a flowchart showing a method for manufacturing a nitride-based phosphor according to a first comparison example of the present inventive concept.

The present comparison example also suggests a method for manufacturing a phosphor $(Sr_{0.75}Ba_{0.25})_{0.85}Eu_{0.15}Si_2O_2N_2$, that is, a nitride-based phosphor. However, the phosphor of the present comparison example is manufactured according to a method shown in FIG. 3, which is different from the method of FIG. 2. Referring to FIG. 3, all precursors including $MCO_3(SrCO_3, BaCO_3)$, $SiO_2$, $Eu_2O_3$, and $Si_3N_4$ are simultaneously mixed, and sintered at temperature of about 1400° C. under a nitrogen and hydrogen gas atmosphere, in the same manner as in the second sintering operation of the first embodiment of the present inventive concept, and for about 6 hours, thereby obtaining a phosphor having a composition formula $(Sr_{0.75}Ba_{0.25})_{0.85}Eu_{0.15}Si_2O_2N_2$ as a final product.

Comparison Example 2

A YAG:$Ce^{3+}$ phosphor of Merck, which is commercially available, is used as a phosphor of the second comparison example.

In Table 1 below, the phosphors of the first embodiment of the present inventive concept, the first comparison example, and the second comparison example are listed.

TABLE 1

| Embodiment and Comparison example | Phosphor |
|---|---|
| Embodiment 1 | $(Sr_{0.75}Ba_{0.25})_{0.85}Eu_{0.15}Si_2O_2N_2$ |
| Comparison example 1 | $(Sr_{0.75}Ba_{0.25})_{0.85}Eu_{0.15}Si_2O_2N_2$ |
| Comparison example 2 | YAG:$Ce^{3+}$ |

Evaluation of High-Temperature Stability

Figure 4:
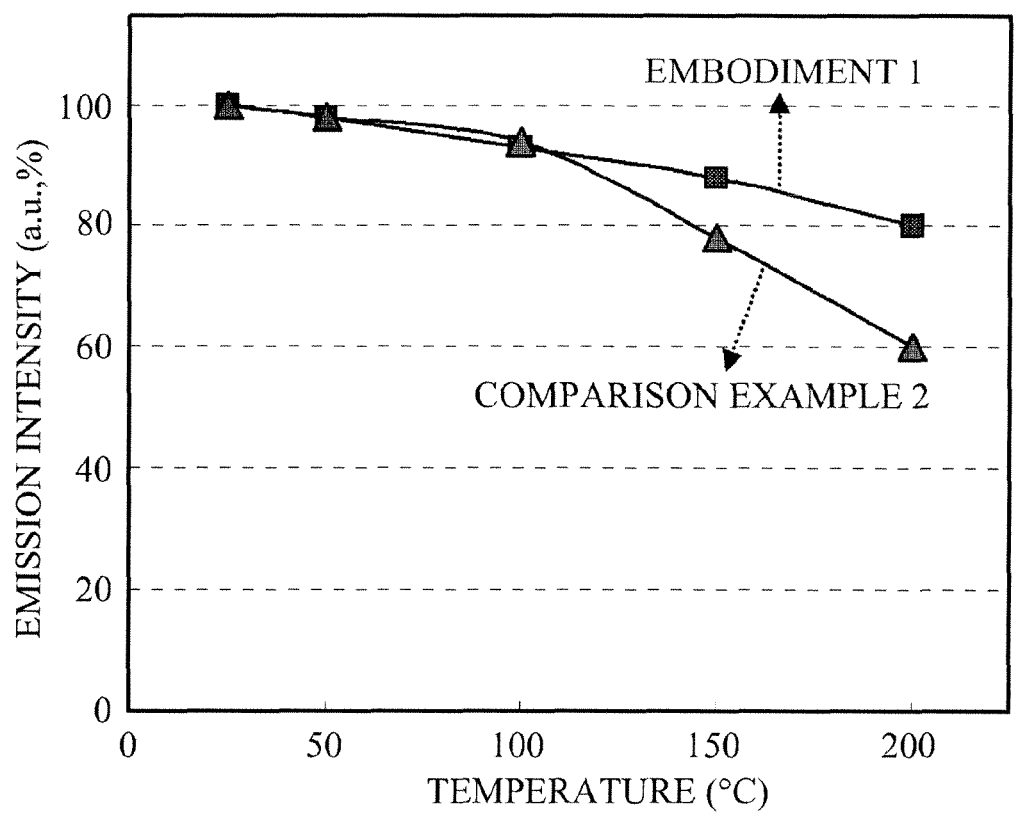
FIG. 4 illustrates a graph showing an emission intensity according to temperature, regarding a phosphor manufactured in the first embodiment of the present inventive concept and a phosphor manufactured in a second comparison example of the present inventive concept.

FIG. 4 illustrates a graph showing an emission intensity according to temperature, regarding the phosphor manufactured in the first embodiment of the present inventive concept and the phosphor manufactured in the second comparison example.

Referring to FIG. 4, at about 150° C. to about 200° C. which is a general LED driving temperature, the emission intensity of the phosphor of the first embodiment of the present inventive concept is at least 80% of an emission intensity under normal temperature, compared to a YAG phosphor of the second comparison example. Considering that the YAG phosphor of the second comparison example has about 60% emission intensity of the normal temperature emission intensity, the phosphor of the first embodiment of the present inventive concept is proved to have about 20% superior characteristic to the YAG phosphor of the second comparison example.

Evaluation of Emission Characteristics

Figure 5:
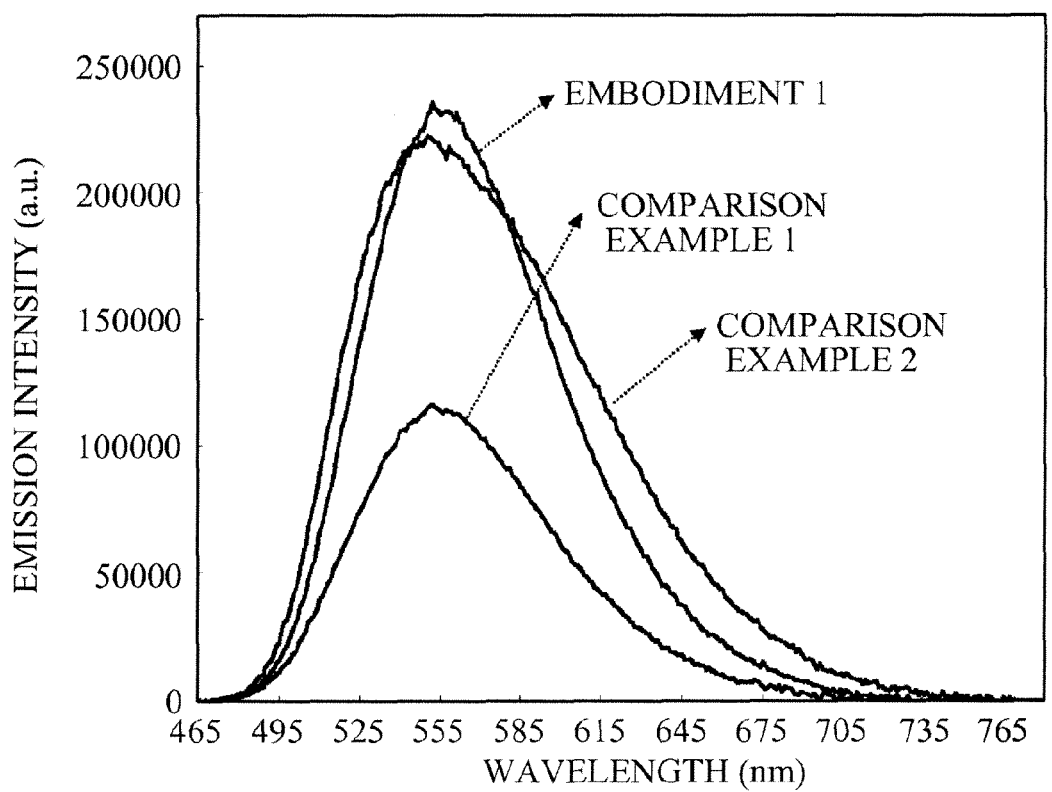
FIG. 5 illustrates emission spectrums of the phosphor of the first embodiment of the present inventive concept, the phosphor of the first comparison example, and the phosphor of the second comparison example.

FIG. 5 illustrates emission spectrums of the phosphor of the first embodiment of the present inventive concept, the phosphor of the first comparison example, and the phosphor of the second comparison example.

Referring to FIG. 5, the phosphor of the first embodiment of the present inventive concept shows at least twice as high emission intensity (integral intensity) as the phosphor of the first comparison example synthesized by the conventional solid phase method. In addition, the phosphor of the first embodiment of the present inventive concept shows about 90% emission intensity of the emission intensity of the YAG phosphor of the second comparison example. That is, the phosphor of the first embodiment of the present inventive concept has the sufficient emission intensity to replace the YAG phosphor.

Comprehensive Evaluation

The phosphor of the first embodiment of the present inventive concept has an excellent emission intensity compared to the phosphor synthesized by the conventional solid phase method in the second comparison example, and also has an excellent high-temperature stability compared to the phosphor of the second comparison example. Especially, the phosphor of the first embodiment of the present inventive concept has similar emission characteristic to the YAG phosphor, while having the excellent high-temperature stability. That is, the phosphor of the first embodiment of the present inventive concept has high applicability to the LED. Thus, the phosphor of the first embodiment of the present inventive concept is expected to stably replace the conventional YAG phosphor.

Hereinafter, the LED to which is applied the nitride-based phosphor according to example embodiments of the present inventive concept will be described with reference to the accompanying drawings.

Figure 6:
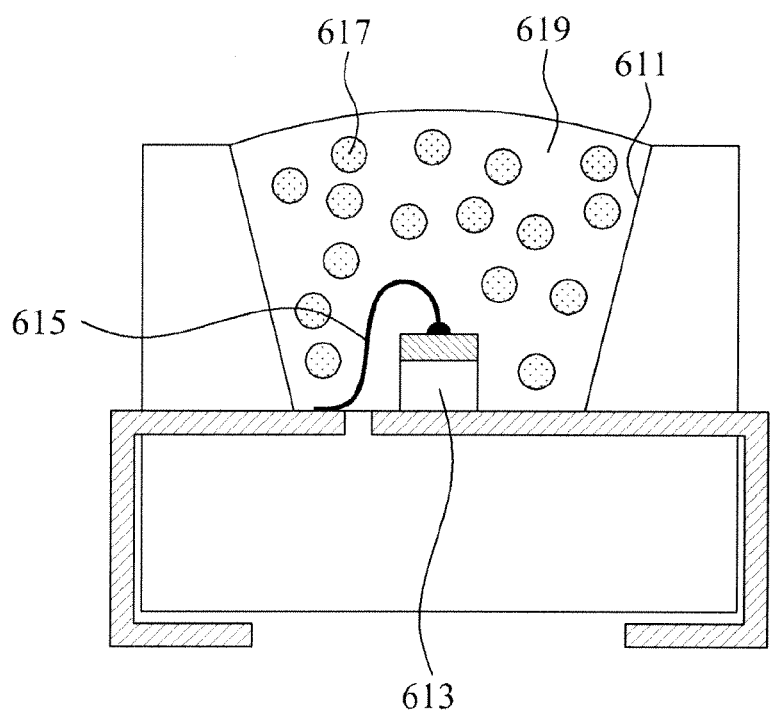
FIG. 6 illustrates a sectional view showing a structure of a white light emitting diode (LED) according to example embodiments of the present inventive concept.

FIG. 6 illustrates a sectional view showing a structure of a white LED according to example embodiments of the present inventive concept.

Referring to FIG. 6, the white LED using a blue LED or a long-wavelength ultraviolet (UV) LED may include a reflection cup 611, an InGaN-based LED chip 613 (GaN-based LED in case of the long-wavelength UV LED) installed on the reflection cup 611, a yellow phosphor 617 excited by light emitted from the LED chip 613, electrode line 615 connected to the LED chip 613, and a light-transmitting epoxy 619 sealing the LED chip 613. The yellow phosphor 617 may function as a wavelength converting material. The above-described nitride-based phosphor according to embodiments of the present inventive concept may be used as the yellow phosphor 617.

The InGaN-based LED chip 613 may be connected with an external power supply by the electrode line 615. The yellow phosphor 617 excited by the light emitted from the InGaN-based LED chip 613 may be mixed with the light-transmitting epoxy 619 and disposed at the outside of the LED chip 613. However, the present inventive concept is not limited to the structure shown in FIG. 1, the LED may have various structures where components are properly added, altered, and omitted. Also, the yellow phosphor 617 may be mixed with silicone, besides the epoxy, and molded around the LED chip 613, thereby forming the white LED.

That is, the yellow phosphor 617 may be disposed at the outside of the LED chip 613 such that the light emitted from the LED chip 613 functions to excite the yellow phosphor 617.

Procedures for forming a white light will be described in detail. A blue light emitted from the LED chip 613 may be passed through the yellow phosphor 617 according to the above-described example embodiments of the present inventive concept. Part of the blue light may excite the yellow phosphor 617, thereby forming a yellow light, while the rest part of the blue light may be passed as it is. Thus, the white light may be formed as the excited yellow light and the blue light overlap each other.

Hereinafter, a nitride-based phosphor manufactured in the foregoing manner will be described in detail.

Embodiment 2

A nitride-based phosphor manufactured in Embodiment 2 of the present inventive concept is a mixed-phase phosphor generated from an initial composition $(Sr_{0.71}Ba_{0.29})_{0.92}Eu_{0.08}Si_2O_2N_2$. In the same manner as in Embodiment 1 of the present inventive concept, the phosphor of Embodiment 2 of the present inventive concept is manufactured in the order illustrated in FIG. 2.

Referring to FIG. 2, precursors $MCO_3(SrCO_3, BaCO_3)$ and $SiO_2$ belonging to a first group are mixed, and sintered for about 3 hours at temperature of about 1100° C. under air atmosphere, thereby obtaining an intermediate sintered product $M_2SiO_4$. Likewise, precursors $Eu_2O_3$, $SiO_2$ and $Si_3N_4$ belonging to a second group are mixed, and sintered for about 3 hours at temperature of about 1300° C. under a nitrogen and hydrogen gas atmosphere, thereby obtaining an intermediate sintered product $EuSi_2O_2N_2$. Next, the intermediate sintered products $M_2SiO_4$ and $EuSi_2O_2N_2$ are mixed with $Si_3N_4$ that is an additional Si precursor and $NH_4Cl$ that is a flux. The generated mixture is sintered again at temperature of about 1400° C. under a nitrogen and hydrogen gas atmosphere, thereby manufacturing a mixed-phase phosphor as a final product. The manufactured phosphor is washed using 5% (v/v) $HNO_3$ solution and deionized (DI) water, thereby removing impurities and an intermediate phase. An x-ray diffraction (XRD) pattern and an emission wavelength of the above-manufactured phosphor are shown in FIGS. 7A and 7B.

Referring to FIG. 7A, since two types of main diffraction peaks are observed, it is determined that two types of XRD patterns are simultaneously shown. Accordingly, it may be understood that the phosphor of Embodiment 2 of the present inventive concept is a mixed-phase phosphor including two different phosphors.

Figure 7B:
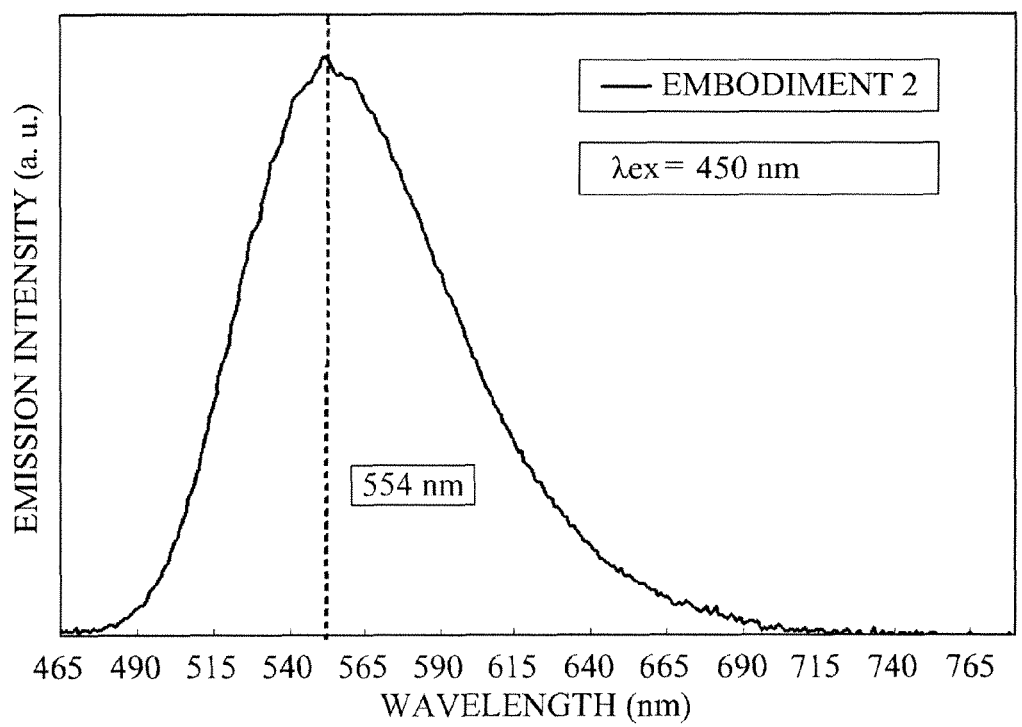

As shown in FIG. 7B, by excitation of light of about 450 nm which is a typical wavelength of a blue LED, the phosphor of Embodiment 2 of the present inventive concept shows an emission spectrum in a range of about 460 nm to 760 nm and an emission peak of about 554 nm. According to such optical properties, the phosphor of Embodiment 2 of the present inventive concept shows yellow emission, which means that the phosphor of Embodiment 2 of the present inventive concept has emission characteristics enough to replace the YAG phosphor.

Embodiment 3

A nitride-based phosphor manufactured in Embodiment 3 of the present inventive concept is a mixed-phase phosphor generated from an initial composition $(Sr_{0.65}Ba_{0.35})_{0.88}Eu_{0.12}Si_2O_2N_2$. In the same manner as in Embodiment 1 of the present inventive concept, the phosphor of Embodiment 3 of the present inventive concept is manufactured in the order illustrated in FIG. 2.

Referring to FIG. 2, precursors $MCO_3(SrCO_3, BaCO_3)$ and $SiO_2$ belonging to a first group are mixed, and sintered for about 3 hours at temperature of about 1100° C. under air atmosphere, thereby obtaining an intermediate sintered product $M_2SiO_4$. Likewise, precursors $Eu_2O_3$, $SiO_2$ and $Si_3N_4$ belonging to a second group are mixed, and sintered for about 3 hours at temperature of about 1300° C. under a nitrogen and hydrogen gas atmosphere, thereby obtaining an intermediate sintered product $EuSi_2O_2N_2$. Next, the intermediate sintered products $M_2SiO_4$ and $EuSi_2O_2N_2$ are mixed with $Si_3N_4$ that is an additional Si precursor and $NH_4Cl$ that is a flux. The generated mixture is sintered again at temperature of about 1400° C. under a nitrogen and hydrogen gas atmosphere, thereby manufacturing a mixed-phase phosphor as a final product. The manufactured phosphor is washed using 5% (v/v) $FINO_3$ solution and DI water, thereby removing impurities and an intermediate phase. An XRD pattern and an emission wavelength of the above-manufactured phosphor are shown in FIGS. 8A and 8B.

Referring to FIG. 8A, since two types of main diffraction peaks are observed, it is determined that two types of XRD patterns are simultaneously shown. Accordingly, it may be understood that the phosphor of Embodiment 3 of the present inventive concept is a mixed-phase phosphor including two different phosphors.

Figure 8B:
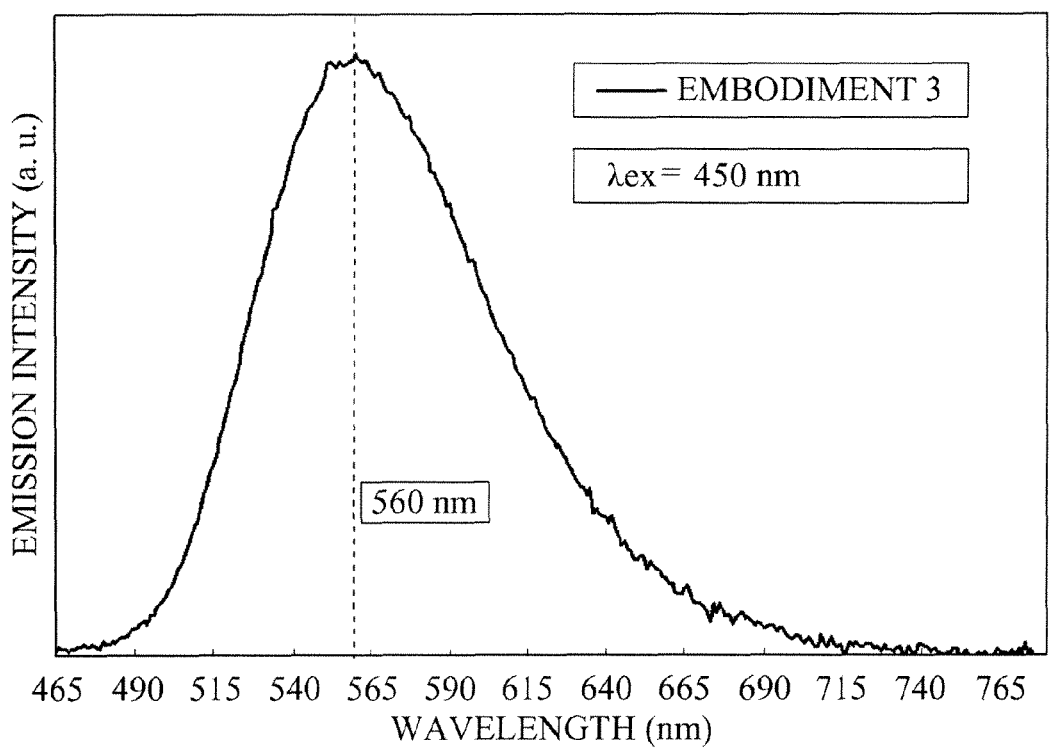

As shown in FIG. 8B, by excitation of light of about 450 nm which is a typical wavelength of a blue LED, the phosphor of Embodiment 3 of the present inventive concept shows an emission spectrum in a range of about 460 nm to 760 nm and an emission peak of about 560 nm. According to such optical properties, the phosphor of Embodiment 3 of the present inventive concept shows yellow emission, which means that the phosphor of Embodiment 3 of the present inventive concept has enough emission characteristics to replace the YAG phosphor.

Embodiment 4

A nitride-based phosphor manufactured in Embodiment 4 of the present inventive concept has a composition formula $(Sr_{0.31}Ba_{0.69})_{0.85}Eu_{0.15}Si_2O_2N_2$. In the same manner as in Embodiment 1 of the present inventive concept, the phosphor of Embodiment 4 of the present inventive concept is manufactured in the order illustrated in FIG. 2.

Referring to FIG. 2, precursors $MCO_3(SrCO_3, BaCO_3)$ and $SiO_2$ belonging to a first group are mixed, and sintered for about 3 hours at temperature of about 1100° C. under air atmosphere, thereby obtaining an intermediate sintered product $M_2SiO_4$. Likewise, precursors $Eu_2O_3$, $SiO_2$ and $Si_3N_4$ belonging to a second group are mixed, and sintered for about 3 hours at temperature of about 1300° C. under a nitrogen and hydrogen gas atmosphere, thereby obtaining an intermediate sintered product $EuSi_2O_2N_2$. Next, the intermediate sintered products $M_2SiO_4$ and $EuSi_2O_2N_2$ are mixed with $Si_3N_4$ that is an additional Si precursor and $NH_4Cl$ that is a flux. The generated mixture is sintered again at temperature of about 1400° C. under a nitrogen and hydrogen gas atmosphere, thereby manufacturing a single-phase phosphor having a composition formula $(Sr_{0.31}Ba_{0.69})_{0.85}Eu_{0.15}Si_2O_2N_2$ as a final product. Next, the manufactured phosphor is washed using 5% (v/v) $HNO_3$ solution and DI water, thereby removing impurities and an intermediate phase. An XRD pattern and an emission wavelength of the above-manufactured phosphor are shown in FIGS. 9A and 9B.

Figure 9A:
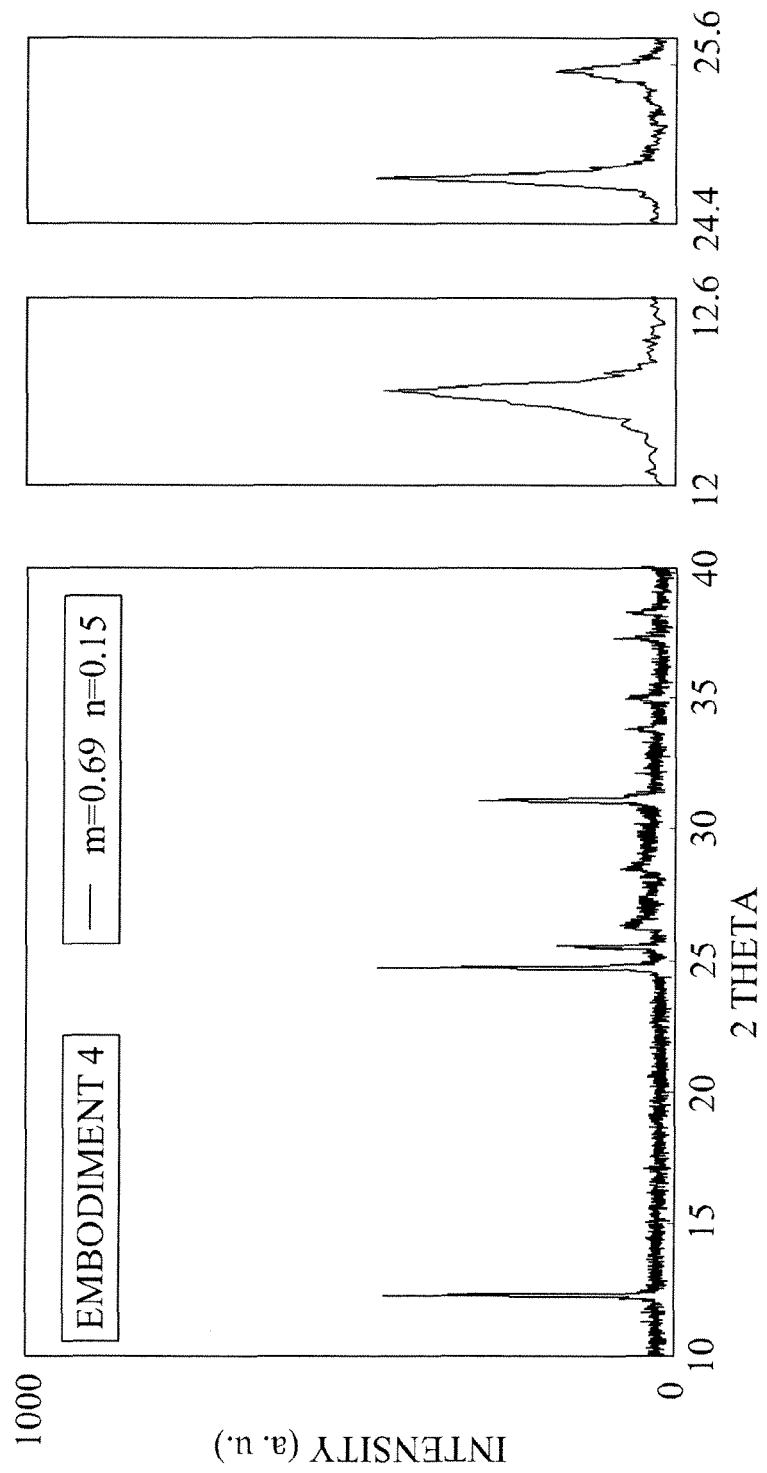
FIGS. 9A and 9B illustrate graphs respectively showing an XRD pattern and an emission spectrum of a phosphor manufactured in a fourth embodiment of the present inventive concept.

Referring to FIG. 9A, since a single type of main diffraction peak is observed, it is determined that the XRD pattern is shown according to the single phase. Accordingly, it may be understood that the phosphor of Embodiment 4 of the present inventive concept is a single-phase phosphor.

Figure 9B:
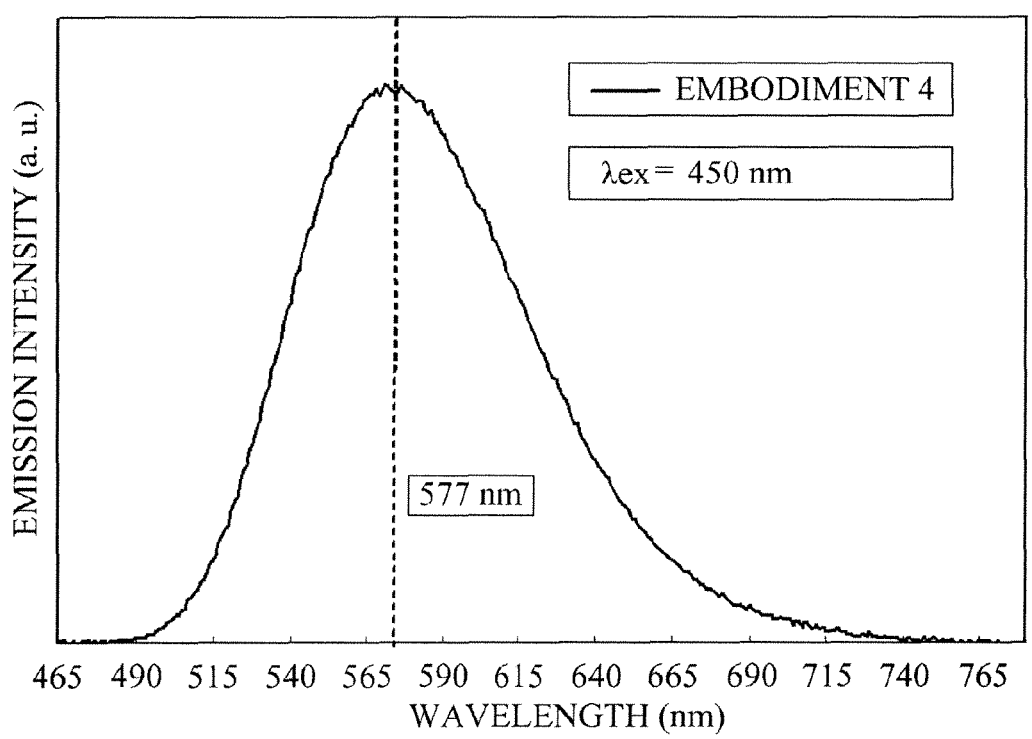

As shown in FIG. 9B, by excitation of light of about 450 nm which is a typical wavelength of a blue LED, the phosphor of Embodiment 4 of the present inventive concept shows an emission spectrum in a range of about 465 nm to 765 nm and an emission peak of about 577 nm. According to such optical properties, the phosphor of Embodiment 4 of the present inventive concept shows yellow emission, which means that the phosphor of Embodiment 4 of the present inventive concept has sufficient emission characteristics to replace the YAG phosphor.

Embodiment 5

A nitride-based phosphor manufactured in Embodiment 5 of the present inventive concept is a single-phase phosphor having a composition formula $(Sr_{0.35}Ba_{0.65})_{0.85}Eu_{0.15}Si_2O_2N_2$. In the same manner as in Embodiment 1 of the present inventive concept, the phosphor of Embodiment 5 of the present inventive concept is manufactured in the order illustrated in FIG. 2.

Figure 10:
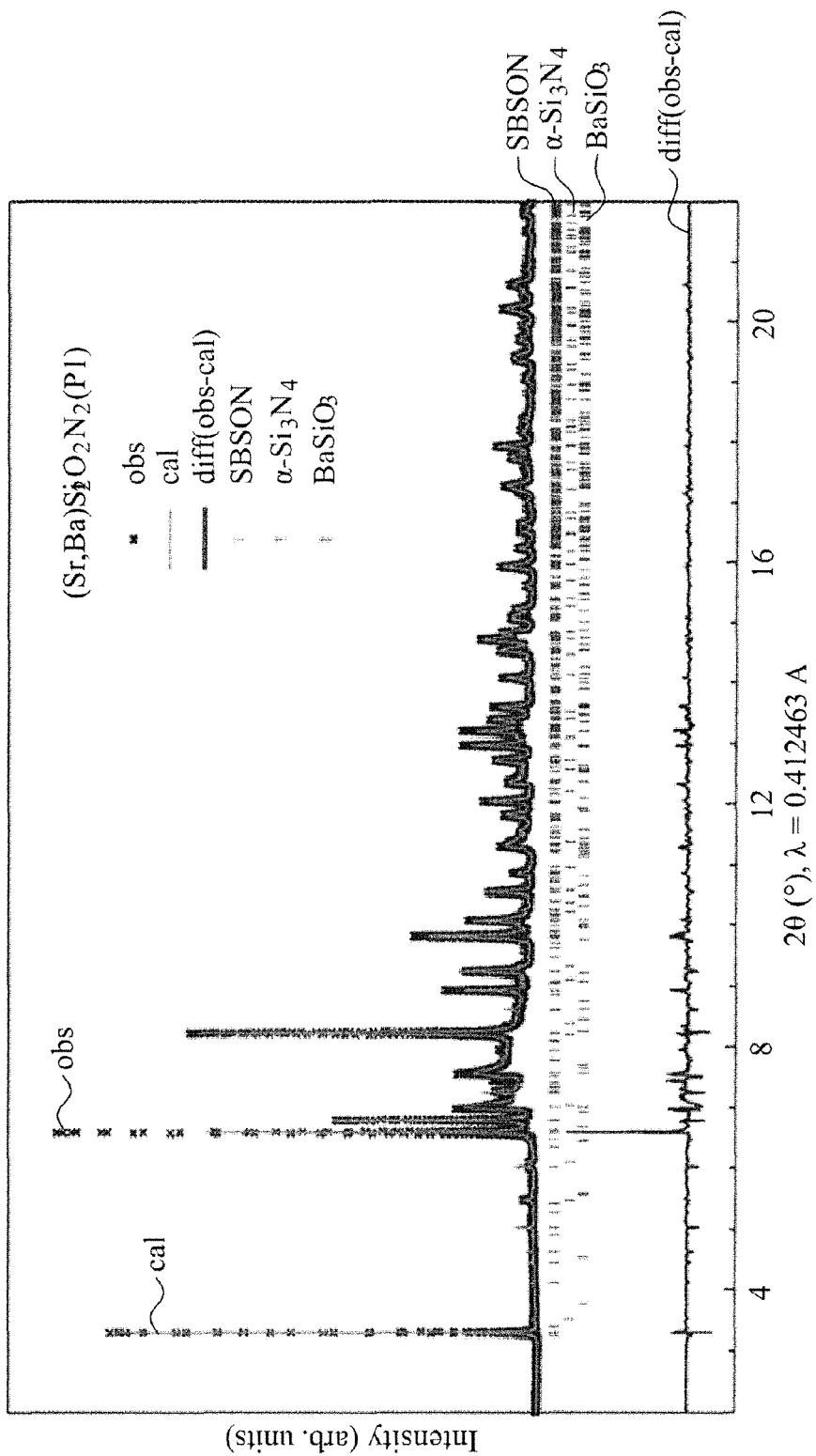
FIG. 10 illustrates a diagram showing a Rietveld fitting result with respect to a phosphor manufactured in a fifth embodiment of the present inventive concept.

Referring to FIG. 2, precursors $MCO_3(SrCO_3, BaCO_3)$ and $SiO_2$ belonging to a first group are mixed, and sintered for about 3 hours at temperature of about 1100° C. under air atmosphere, thereby obtaining an intermediate sintered product $M_2SiO_4$. Likewise, precursors $Eu_2O_3$, $SiO_2$ and $Si_3N_4$ belonging to a second group are mixed, and sintered for about 3 hours at temperature of about 1300° C. under a nitrogen and hydrogen gas atmosphere, thereby obtaining an intermediate sintered product $EuSi_2O_2N_2$. Next, the intermediate sintered products $M_2SiO_4$ and $EuSi_2O_2N_2$ are mixed with $Si_3N_4$ that is an additional Si precursor and $NH_4Cl$ that is a flux. The generated mixture is sintered again at temperature of about 1400° C. under a nitrogen and hydrogen gas atmosphere, thereby manufacturing a single-phase phosphor having a composition formula $(Sr_{0.35}Ba_{0.65})_{0.85}Eu_{0.15}Si_2O_2N_2$ as a final product. Next, the manufactured phosphor is washed using 5% (v/v) $HNO_3$ solution and DI water, thereby removing impurities and an intermediate phase. Crystal-structure analysis data of the above-manufactured phosphor is shown in Table 2. A Rietveld fitting result of the phosphor is shown in FIG. 10.

TABLE 2

| | |
|---|---|
| Radiation | Synchrotron X-ray ($\lambda$ = 0.412463 Å) |
| Diffraction angle (2θ) range/step | 2°-32°/0.001° |
| Number of data points | 30000 |
| Formula | $(Sr_{0.35}Ba_{0.65})_{0.85}Eu_{0.15}Si_2O_2N_2$ |
| X-ray density | 4.06 g/cm$^3$ |
| Crystal system | Triclinic |
| Space group | P1 (number 1) |
| Lattice parameters | a = 7.2138 Å, b = 7.4084 Å, c = 7.3368 Å |
| | $\alpha$ = 88.77°, $\beta$ = 84.44°, $\gamma$ = 75.80° |
| Cell volume | 378.32 Å$^3$ (Z = 4) |
| Number of reflections | 1881 |
| R-factors | $R_{wp}$ = 10.8%, $R_p$ = 7.2%, $R_{F2}$ = 4.9%, $\chi$ = 2.1 |

Referring to Table 2, it may be understood that the nitride-based phosphor manufactured in Embodiment 5 of the present inventive concept has a triclinic crystal system and a space group of P1.

Referring to FIG. 10, an XRD pattern of the nitride-based phosphor of Embodiment 5 of the present inventive concept nearly corresponds to a calculated value. Accordingly, it may be determined that the phosphor of Embodiment 5 of the present inventive concept is a single-phase phosphor.

In FIG. 10, 'obs' refers to a measured value of the manufactured phosphor, 'cal' refers to a calculated value obtained through calculation, and 'diff (obs-cal)' refers to a value obtained by subtracting the calculated value from the measured value, from which a degree of purity of the manufactured phosphor may be determined.

Embodiments 6 to 26

Embodiments 6 to 26 of the present inventive concept are related to phosphors having a composition formula $(Sr_{1-m}Ba_m)Si_2O_2N_2$ where values of 'm' are 0, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, and 1, respectively. In the same manner as in Embodiment 1 of the present inventive concept, the phosphors of Embodiments 6 to 26 of the present inventive concept are manufactured in the order illustrated in FIG. 2.

Referring to FIG. 2, precursors $MCO_3(SrCO_3, BaCO_3)$ and $SiO_2$ belonging to a first group are mixed, and sintered for about 3 hours at temperature of about 1100° C. under air atmosphere, thereby obtaining an intermediate sintered product $M_2SiO_4$. Here, since Eu is not included, a process of synthesizing another intermediate sintered product $EuSi_2O_2N_2$ is omitted. Next, the intermediate sintered products $M_2SiO_4$ is mixed with $Si_3N_4$ that is an additional Si precursor and $NH_4Cl$ that is a flux. The generated mixture is sintered again at temperature of about 1400° C. under a nitrogen and hydrogen gas atmosphere, thereby manufacturing a phosphor having a composition formula $(Sr_{1-m}Ba_m)Si_2O_2N_2$ (where 'm' has values between 0 and 1 as aforementioned) as a final product. Next, the manufactured phosphor is washed using 5% (v/v) $HNO_3$ solution and DI water, thereby removing impurities and an intermediate phase. XRD patterns of the above-manufactured phosphors are shown in FIG. 11.

Figure 11:
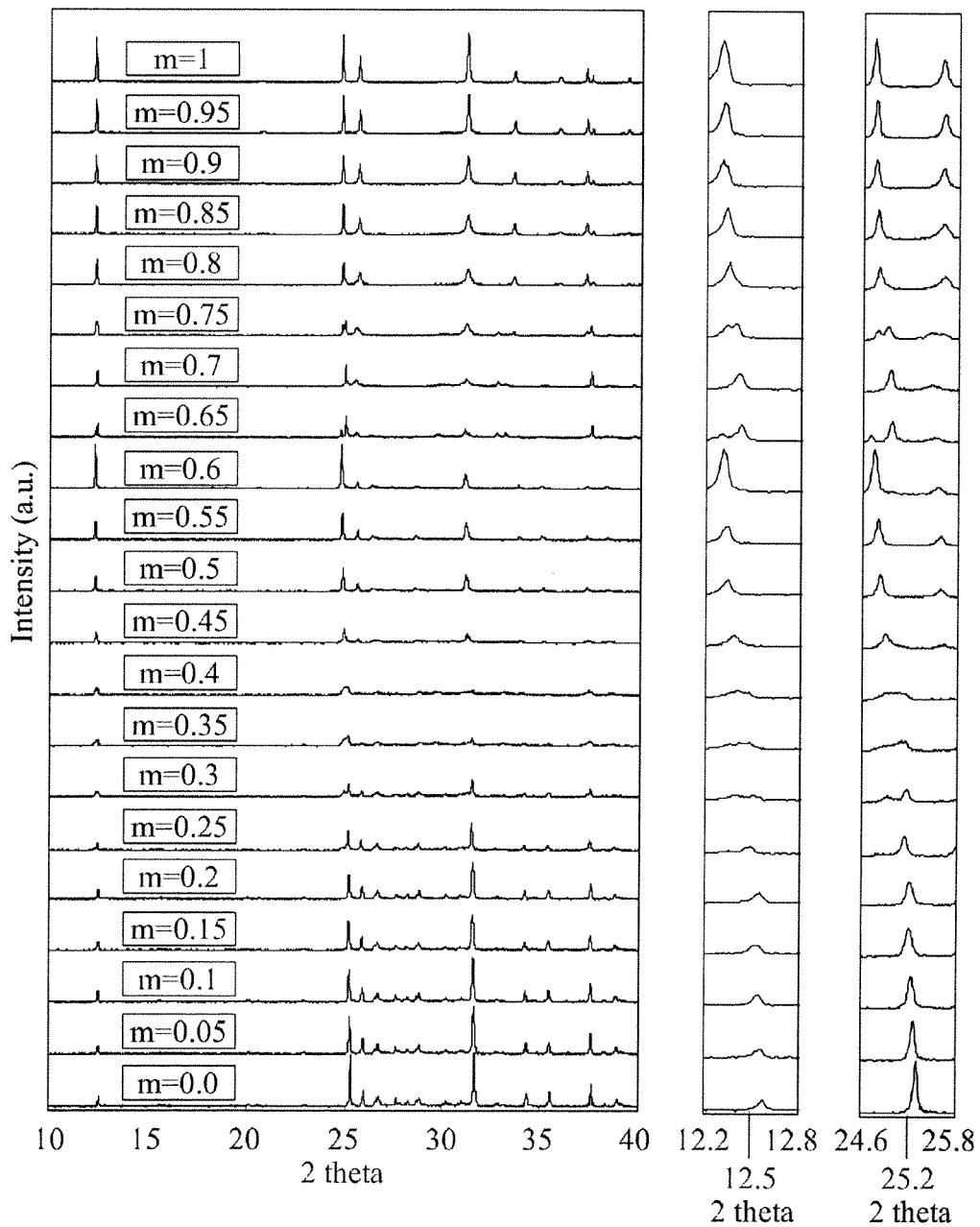
FIG. 11 illustrates graphs showing XRD patterns of phosphor host materials manufactured in a sixth embodiment of the present inventive concept to a twenty-sixth embodiment of the present inventive concept.

Referring to FIG. 11, the XRD patterns are regularly changed according to an increase in Ba content. Therefore, differences in a crystal phase according to the increase in Ba content may be distinguished. Changes in the crystal phase according to a range of Ba content are shown in Table 3.

Embodiments 27 to 41

Embodiments 27 to 41 of the present inventive concept are related to phosphors having a composition formula $(Sr_{1-m}Ba_m)_{1-n}Eu_nSi_2O_2N_2$ in which values of (m, n) are (0, 0.02), (0.3, 0.2), (0.4, 0.15), (0.6, 0.1), (0.6, 0.2), (0.7, 0.05), (0.8, 0.02), (0.8, 0.05), (0.8, 0.1), (0.8, 0.15), (0.8, 0.2), (0.9, 0.1), (1, 0.02), (1, 0.1), and (1, 0.15), respectively. In the same manner as in Embodiment 1 of the present inventive concept, the phosphors of Embodiments 27 to 41 of the present inventive concept are manufactured in the order illustrated in FIG. 2.

Referring to FIG. 2, precursors $MCO_3$ ($SrCO_3$, $BaCO_3$) and $SiO_2$ belonging to a first group are mixed, and sintered for about 3 hours at temperature of about 1100° C. under air atmosphere, thereby obtaining an intermediate sintered product $M_2SiO_4$. Likewise, precursors $Eu_2O_3$, $SiO_2$ and $Si_3N_4$ belonging to a second group are mixed, and sintered for about 3 hours at temperature of about 1300° C. under a nitrogen and hydrogen gas atmosphere, thereby obtaining an intermediate sintered product $EuSi_2O_2N_2$. Next, the intermediate sintered products $M_2SiO_4$ and $EuSi_2O_2N_2$ are mixed with $Si_3N_4$ that is an additional Si precursor and $NH_4Cl$ that is a flux. The generated mixture is sintered again at temperature of about 1400° C. under a nitrogen and hydrogen gas atmosphere, thereby manufacturing a single-phase phosphor having a composition formula $(Sr_{1-m}Ba_m)_{1-n}Eu_nSi_2O_2N_2$ (where m and n have the aforementioned values), as a final product. Next, the manufactured phosphor is washed using 5% (v/v) $HNO_3$ solution and DI water, thereby removing impurities and an intermediate phase. XRD patterns and emission spectrums of the phosphors are shown in FIGS. 12A and 12B.

Figure 12A:
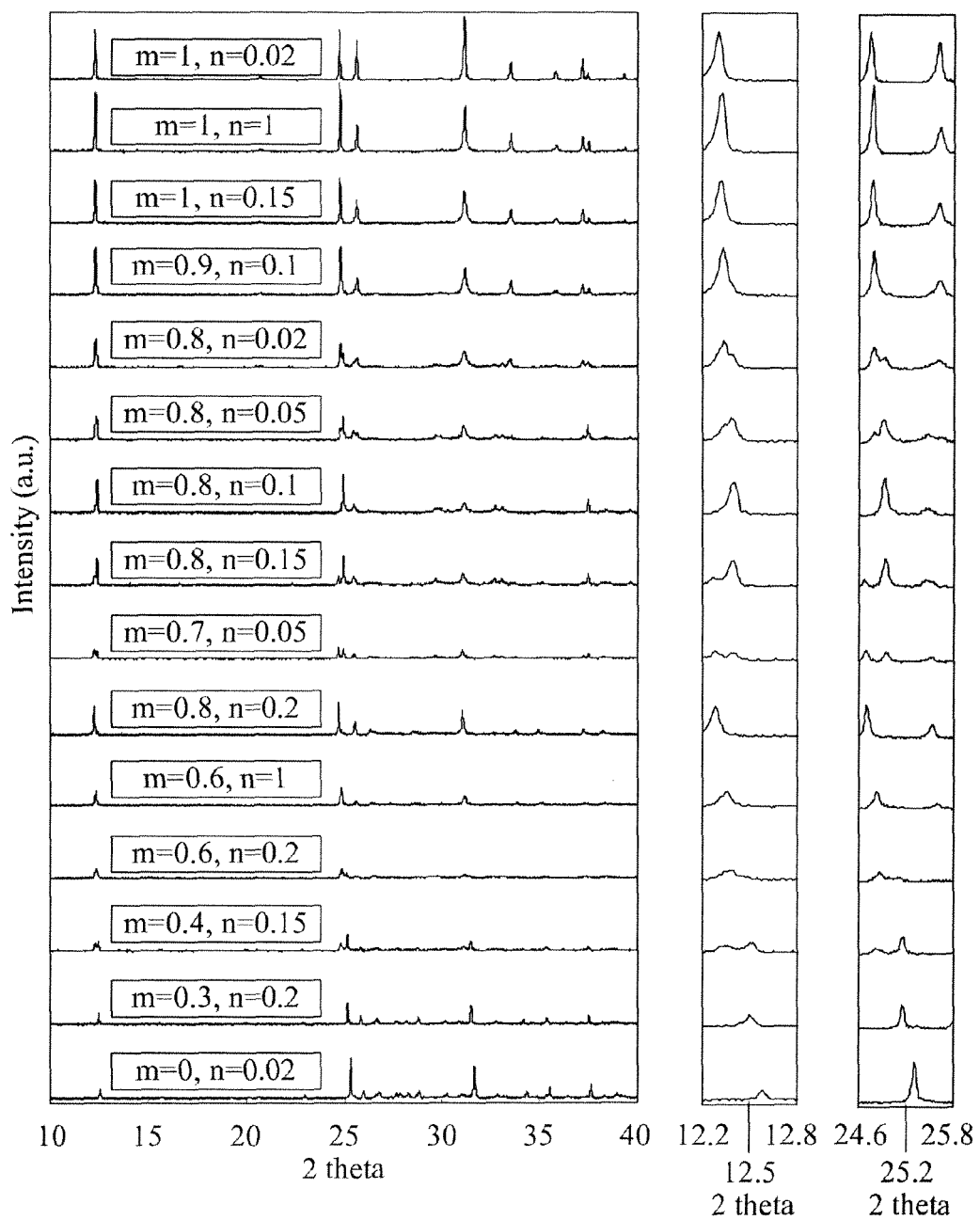
FIGS. 12A and 12B are graphs showing XRD patterns and emission spectrums of phosphors manufactured in a twenty-seventh embodiment of the present inventive concept to a forty-first embodiment of the present inventive concept.

Referring to FIG. 12A, the XRD patterns are regularly changed according to contents of Ba and Eu. Therefore, differences in a crystal phase according to the contents of Ba and Eu may be distinguished. Changes in the crystal phase according to a range of contents of Ba and Eu are shown in Table 4.

Figure 12B:
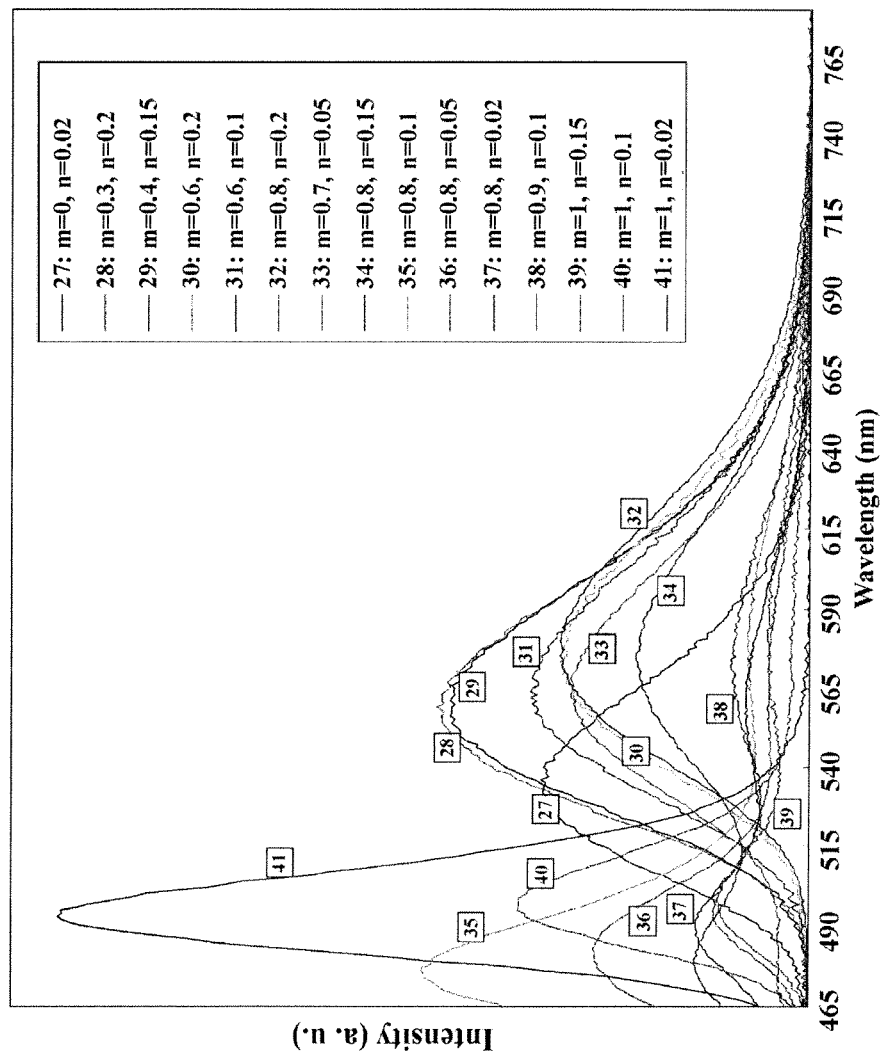

In addition, referring to FIG. 12B, the emission wavelength is changed according to the contents of Ba and Eu, corresponding to the changes in the XRD pattern.

Furthermore, as a result of analysis of phases and emission peak wavelengths Wp of the phosphors manufactured in Embodiments 27 to 41 of the present inventive concept are shown in Table 4. Also, changes in the phase according to the range of m and n values from the XRD patterns of the phosphors manufactured in Embodiments 6 to 26 of the present inventive concept and Embodiments 27 to 41 of the present inventive concept are shown in Table 3.

TABLE 3

| $(Sr_{1-m}Ba_m)Si_2O_2N_2$ | $(Sr_{1-m}Ba_m)_{1-n}Eu_nSi_2O_2N_2$ | Phase |
|---|---|---|
| m = 0 | m = 0 and n = 0 | $SrSi_2O_2N_2$ |
| 0 < m < 0.25 | 0 < m ≤ 0.3 and 0 < m * (1 − n) < 0.25 | $(Sr_{1-m}Ba_m)_{1-n}Eu_nSi_2O_2N_2$ solid solution (→ $SrSi_2O_2N_2$ type: A-phases) |
| 0.25 ≤ m < 0.5 | 0.3 < m ≤ 0.6 and 0.25 ≤ m * (1 − n) < 0.5 | A-phases + B-phases |
| 0.5 ≤ m < 0.65 | 0.6 ≤ m ≤ 0.8 and 0.5 ≤ m * (1 − n) < 0.65 | $(Sr_{1-m}Ba_m)_{1-n}Eu_nSi_2O_2N_2$ solid solution (→ $SrSi_2O_2N_2$ type: B-phases) |
| 0.65 ≤ m < 0.7 | 0.7 ≤ m ≤ 0.8 and 0.65 ≤ m * (1 − n) < 0.7 | B-phases + C-phases |
| 0.7 ≤ m < 0.75 | 0.8 ≤ m ≤ 0.9 and 0.7 ≤ m * (1 − n) < 0.75 | $(Sr_{1-m}Ba_m)_{1-n}Eu_nSi_2O_2N_2$ solid solution (→ unknown type: C-phases) |
| 0.75 ≤ m < 0.8 | 0.8 ≤ m ≤ 0.9 and 0.75 ≤ m * (1 − n) < 0.8 | C-phases + D-phases |
| 0.8 ≤ m < 1 | 0.9 ≤ m ≤ 1 and 0.8 ≤ m * (1 − n) < 1 | $(Sr_{1-m}Ba_m)_{1-n}Eu_nSi_2O_2N_2$ solid solution (→ $BaSi_2O_2N_2$ type: D-phases) |
| m = 1 | m = 1 and n = 0 | $BaSi_2O_2N_2$ |

TABLE 4

| Embodiments | $(Sr_{1-m}Ba_m)_{1-n}Eu_nSi_2O_2N_2$ | Phases | PL Wp (nm) |
|---|---|---|---|
| 27 | m = 0 and n = 0.02 | $(Sr_{1-m}Ba_m)_{1-n}Eu_nSi_2O_2N_2$ solid solution (→ $SrSi_2O_2N_2$ type: A-phases) | 535 |
| 28 | m = 0.3 and n = 0.2 | $(Sr_{1-m}Ba_m)_{1-n}Eu_nSi_2O_2N_2$ solid solution (→ $SrSi_2O_2N_2$ type: A-phases) | 560 |
| 29 | m = 0.4 and n = 0.15 | A-phases + B-phases | 560 |
| 30 | m = 0.6 and n = 0.2 | A-phases + B-phases | 577 |
| 31 | m = 0.6 and n = 0.1 | $(Sr_{1-m}Ba_m)_{1-n}Eu_nSi_2O_2N_2$ solid solution (→ $SrSi_2O_2N_2$ type: B-phases) | 565 |

TABLE 4-continued

| Embodiments | $(Sr_{1-m}Ba_m)_{1-n}Eu_nSi_2O_2N_2$ | Phases | PL Wp (nm) |
|---|---|---|---|
| 32 | m = 0.8 and n = 0.2 | $(Sr_{1-m}Ba_m)_{1-n}Eu_nSi_2O_2N_2$ solid solution (→ $SrSi_2O_2N_2$ type: B-phases) | 579 |
| 33 | m = 0.7 and n = 0.05 | B-phases + C-phases | 473, 566 |
| 34 | m = 0.8 and n = 0.15 | B-phases + C-phases | 479, 577 |
| 35 | m = 0.8 and n = 0.1 | $(Sr_{1-m}Ba_m)_{1-n}Eu_nSi_2O_2N_2$ solid solution (→ unknown type: C-phases) | 477, 578 |
| 36 | m = 0.8 and n = 0.05 | C-phases + D-phases | 483, 579 |
| 37 | m = 0.8 and n = 0.02 | C-phases + D-phases | 492, 567 |
| 38 | m = 0.9 and n = 0.1 | $(Sr_{1-m}Ba_m)_{1-n}Eu_nSi_2O_2N_2$ solid solution (→ $BaSi_2O_2N_2$ type: D-phases) | 495, 575 |
| 39 | m = 1 and n = 0.15 | $(Sr_{1-m}Ba_m)_{1-n}Eu_nSi_2O_2N_2$ solid solution (→ $BaSi_2O_2N_2$ type: D-phases) | 497, 583 |
| 40 | m = 1 and n = 0.1 | $(Sr_{1-m}Ba_m)_{1-n}Eu_nSi_2O_2N_2$ solid solution (→ $SrSi_2O_2N_2$ type: B-phases) | 498, 590 |
| 41 | m = 1 and n = 0.02 | $(Sr_{1-m}Ba_m)_{1-n}Eu_nSi_2O_2N_2$ solid solution (→ $BaSi_2O_2N_2$ type: D-phases) | 494 |

Referring to Tables 3 and 4, a plurality of phases mixedly exist. In general phosphors, changes of a plurality of phases rarely occur according to the changes in a ratio of Sr and Ba between Sr and Ba. However, embodiments of the present inventive concept show that changes of the plurality of phases occur.

Furthermore, the overall XRD pattern is constant even with changes in the m and n values. Also, it may be understood that the phase is a solid solution when the structures are similar although a diffraction angle (2θ) slightly changes.

Although a few example embodiments of the present inventive concept have been shown and described, the present inventive concept is not limited to the described exemplary embodiments. Instead, it would be appreciated by those skilled in the art that changes may be made in these example embodiments of the present inventive concept without departing from the principles and spirit of the disclosure, the scope of which is defined in the claims and their equivalents.

The invention claimed is:

1. A method for manufacturing a phosphor expressed by a composition formula $M_{1-z}Eu_zSi_aO_bN_c$ ($M=Sr_{1-x-y}Ba_xCa_y$, 0≤x≤0.5, 0≤y≤0.2, 0<z≤0.3, 2≤a≤2.5, 1.5≤b≤2, and 2≤c≤2.5), the method comprising:
   a first sintering step, comprising:
      a first mixture sintering step to generate a first sintered product by mixing and sintering a first precursor group that contains an M precursor and a first Si precursor, and
      a second mixture sintering step to generate a second sintered product by mixing and sintering a second precursor group that contains an Eu precursor and a second Si precursor; and
   a second sintering step to mix and sinter the first sintered product and the second sintered product.

2. The method of claim 1, wherein the first sintering step further comprises:
   generating the first sintered product by mixing and sintering the first precursor group containing $MCO_3$ and $SiO_2$; and
   generating the second sintered product by mixing and sintering the second group containing $Eu_2O_3$, $SiO_2$ and $Si_3N_4$.

3. The method of claim 1, wherein the first mixture sintering step is performed at temperature of about 900° C. to about 1300° C.

4. The method of claim 1, wherein the second mixture sintering step is performed at temperature of about 1200° C. to about 1400° C.

5. The method of claim 1, wherein the second mixture sintering step includes adding a silicon nitride compound.

6. The method of claim 2, wherein the second sintering step includes adding $Si_3N_4$.

7. The method of claim 1, wherein: the second mixture sintering step includes adding at least one of $NH_4A$ where A denotes at least one of F and Cl, $DE_2$ where D denotes at least one of Ca, Sr, and Ba and E denotes at least one of F and Cl, and LE where L denotes at least one of Na and K and E denotes at least one of F and Cl.

8. The method of claim 1, wherein the second mixture sintering step is performed under a nitrogen and hydrogen gas atmosphere.

9. The method of claim 1, wherein the second mixture sintering step is performed at temperature of about 1300° C. to about 1600° C.

10. The method of claim 1, wherein the first sintered product comprises a solid solution containing at least two kinds of M ions.

11. The method of claim 1, wherein the second sintered product comprises $EuSi_2O_2N_2$.

12. A phosphor in a single phase expressed by a composition formula $M_{1-z}Eu_zSi_aO_bN_c$ ($M=Sr_{1-x-y}Ba_xCa_y$, 0≤x≤0.5, 0≤y≤0.2, 0<z≤0.3, 2≤a≤2.5, 1.5≤b≤2, and 2≤c≤2.5),
   wherein a concentration of an oxynitride having an atomic ratio of O/N>1 is 1 mol % or less with respect to the whole phosphor.

13. The phosphor of claim 12, wherein:
   at a temperature of about 150° C. to about 200° C., which is a driving temperature of a light emitting diode (LED), the phosphor has at least 80% emission intensity of an emission intensity under normal temperature.

14. A white light emitting diode (LED) comprising a phosphor in a single phase expressed by a composition formula $M_{1-z}Eu_zSi_aO_bN_c$ ($M=Sr_{1-x-y}Ba_xCa_y$, 0≤x≤0.5, 0≤y≤0.2, 0<z≤0.3, 2≤a≤2.5, 1.5≤b≤2, and 2≤c≤2.5), as a yellow phosphor which is a wavelength converting material, wherein a concentration of an oxynitride having an atomic ratio of O/N>1 is 1 mol % or less with respect to the whole phosphor.

15. The white LED of claim 14, wherein at a temperature of about 150° C. to about 200° C., the white LED has at least 80% emission intensity of an emission intensity under normal temperature.

16. A nitride-based phosphor as a phosphor expressed by a composition formula $M_{1-n}Eu_nSi_aO_bN_c$ ($M=Sr_{1-m}Ba_m$, $0.25<m\leq0.3$, $0<m\times(1-n)<0.25$, $2\leq a\leq2.5$, $1.5\leq b\leq2$, and $2\leq c\leq2.5$), wherein a concentration of an oxynitride having an atomic ratio of O/N>1 is 0.01 mol % or less with respect to the whole phosphor.

17. The nitride-based phosphor of claim 16, wherein the phosphor has a triclinic crystal system and a space group of P1.

18. The nitride-based phosphor of claim 16, wherein the phosphor includes a complete solid solution in an Sr—Eu system or Sr—Ba—Eu system.

19. The nitride-based phosphor of claim 16, wherein diffraction angles with respect to three diffraction peaks having a high intensity are in ranges of $12.50\leq 2\theta\leq 12.60$, $25.16\leq 2\theta\leq 25.30$, and $31.51\leq 2\theta\leq 31.65$, respectively, in an X-ray diffraction (XRD) pattern of the phosphor.

20. The nitride-based phosphor of claim 16, wherein the phosphor has an emission wavelength in a range of 460 nm to 750 nm.

21. A nitride-based phosphor as a single-phase phosphor expressed by a composition formula $M_{1-n}Eu_nSi_aO_bN_c$ ($M=Sr_{1-m}Ba_m$, $0.6\leq m\leq 0.8$, $0.5\leq m\times(1-n)<0.65$, $2\leq a\leq 2.5$, $1.5\leq b\leq 2$, and $2\leq c\leq 2.5$), wherein a concentration of an oxynitride having an atomic ratio of O/N>1 is 0.01 mol % or less with respect to the whole phosphor.

22. The nitride-based phosphor of claim 21, wherein the phosphor has a triclinic crystal system and a space group of P1.

23. The nitride-based phosphor of claim 21, wherein the phosphor includes a complete solid solution in an Sr—Ba—Eu system.

24. The nitride-based phosphor of claim 21, wherein diffraction angles with respect to four diffraction peaks having a high intensity are in ranges of $12.30\leq 2\theta\leq 12.38$, $24.75\leq 2\theta\leq 24.88$, $25.56\leq 2\theta\leq 25.62$, and $31.09\leq 2\theta\leq 31.25$, respectively, in an X-ray diffraction (XRD) pattern of the phosphor.

25. The nitride-based phosphor of claim 21, wherein the phosphor has an emission wavelength in a range of 465 nm to 765 nm.

26. A nitride-based phosphor as a mixed-phase phosphor generated from an initial composition $M_{1-n}Eu_nSi_aO_bN_c$ ($M=Sr_{1-m}Ba_m$, $0.3\leq m\leq 0.6$, $0.25\leq m\times(1-n)<0.5$, $2\leq a\leq 2.5$, $1.5\leq b\leq 2$, and $2\leq c\leq 2.5$), wherein a concentration of an oxynitride having an atomic ratio of O/N>1 is 0.01 mol % or less with respect to the whole phosphor.

27. The nitride-based phosphor of claim 26, wherein the phosphor comprises two different phases having a triclinic crystal system and a space group of P1.

28. The nitride-based phosphor of claim 26, wherein the phosphor comprises two different phases forming a complete solid solution in an Sr—Ba—Eu system.

29. The nitride-based phosphor of claim 28, wherein:

in an X-ray diffraction (XRD) pattern of the phosphor, one of the two different phases has diffraction angles with respect to three diffraction peaks having a high intensity, the diffraction angles being in ranges of $12.47\leq 2\theta\leq 12.49$, $25.13\leq 2\theta\leq 25.15$, and $31.48\leq 2\theta\leq 31.50$, respectively, and the other one of the two different phases has diffraction angles with respect to three diffraction peaks having a high intensity, the diffraction angles being in ranges of $12.39\leq 2\theta\leq 12.45$, $24.89\leq 2\theta\leq 24.95$, and $31.26\leq 2\theta\leq 31.41$, respectively.

30. The nitride-based phosphor of claim 26, wherein the phosphor has an emission wavelength in a range of 460 nm to 760 nm.

* * * * *